United States Patent
Kitamura et al.

(10) Patent No.: US 11,582,882 B2
(45) Date of Patent: Feb. 14, 2023

(54) INFORMATION PROCESSING APPARATUS AND CONTROL METHOD

(71) Applicant: LENOVO (SINGAPORE) PTE. LTD., Singapore (SG)

(72) Inventors: Masahiro Kitamura, Yokohama (JP);
Shogo Akiyama, Yokohama (JP);
Takuroh Kamimura, Yokohama (JP);
Atsunobu Nakamura, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 17/447,467

(22) Filed: Sep. 13, 2021

(65) Prior Publication Data
US 2022/0174841 A1    Jun. 2, 2022

(30) Foreign Application Priority Data
Nov. 30, 2020  (JP) .............................. JP2020-199085

(51) Int. Cl.
*H05K 7/20*     (2006.01)
*G06F 1/20*     (2006.01)
*G06F 1/16*     (2006.01)

(52) U.S. Cl.
CPC ....... *H05K 7/20209* (2013.01); *G06F 1/1616* (2013.01); *G06F 1/203* (2013.01); *H05K 7/20136* (2013.01)

(58) Field of Classification Search
CPC ............ H05K 7/20209; H05K 7/20136; G06F 1/1616; G06F 1/203
See application file for complete search history.

(56) References Cited

U.S. PATENT DOCUMENTS

| 7,327,559 B2 * | 2/2008 | Fox ...................... G06F 1/1616 |
| | | 219/209 |
| 9,624,937 B2 * | 4/2017 | Makley ................. F04D 27/008 |
| 10,338,636 B2 * | 7/2019 | Li .......................... G06F 1/3271 |
| 2004/0042173 A1 * | 3/2004 | Tomioka ................. G06F 1/203 |
| | | 361/679.53 |

(Continued)

FOREIGN PATENT DOCUMENTS

| CN | 104131989 A | * 11/2014 |
| JP | 2004095890 A |   3/2004 |

(Continued)

OTHER PUBLICATIONS

Oyama et al. Information processing device, control method and control program thereof, May 24, 2018, 17447467 translate Espacenet (Year: 2018).*

*Primary Examiner* — Michael A Matey
(74) *Attorney, Agent, or Firm* — Shimokaji IP

(57) ABSTRACT

An information processing apparatus includes: a first chassis having a first surface provided with at least an air intake port; a second chassis which is connected to the first chassis in a relatively rotatable manner and has a second surface that overlaps the first surface of the first chassis by the rotation; a heat dissipation unit having a fan for replacing air in the first chassis with outside air through at least the air intake port; a state detection unit that detects whether a state is a first state in which the first surface and the second surface overlap; and a control unit which changes control of the fan according to whether the state is the first state.

7 Claims, 12 Drawing Sheets

(56) References Cited

U.S. PATENT DOCUMENTS

| | | | |
|---|---|---|---|
| 2005/0023265 A1* | 2/2005 | Lyle | G06F 1/1616 |
| | | | 219/209 |
| 2012/0033427 A1* | 2/2012 | Chen | G06F 3/0202 |
| | | | 361/679.08 |
| 2012/0265363 A1* | 10/2012 | Hung | F04D 27/004 |
| | | | 700/300 |
| 2014/0108832 A1* | 4/2014 | Yamaguchi | G06F 1/203 |
| | | | 713/320 |
| 2014/0160657 A1* | 6/2014 | Morrison | G06F 1/1632 |
| | | | 361/679.21 |
| 2020/0050247 A1* | 2/2020 | North | G06F 1/1681 |

FOREIGN PATENT DOCUMENTS

| | | | |
|---|---|---|---|
| JP | 2007226617 A | 9/2007 | |
| JP | 2007272272 A | 10/2007 | |
| JP | 2009245121 A | 10/2009 | |
| JP | 2011010302 A | 1/2011 | |
| JP | 2014078199 A | 5/2014 | |
| JP | 2017033116 A | 2/2017 | |
| JP | 2018081481 A | 5/2018 | |

* cited by examiner

INFORMATION PROCESSING APPARATUS AND CONTROL METHOD

FIELD OF THE INVENTION

The present invention relates to an information processing apparatus and a control method.

BACKGROUND OF THE INVENTION

In information processing apparatuses such as laptop PCs (personal computers), electronic devices such as CPUs (Central Processing Units) generate heat when operated, leading to temperature rises therein. Some of such information processing apparatuses perform thermal control to suppress the temperature rises of the chassis. Some means for the thermal control are configured to include temperature sensors for measuring the temperatures of major electronic devices and the like and fans for heat dissipation to replace the air inside the chassis with outside air, and to control the rotation speeds of the fans on the basis of the detection results of the temperature sensors (refer to, for example, Japanese Unexamined Patent Application Publication No. 2007-226617).

However, the chassis is provided with an intake port for taking in outside air, but if it becomes difficult to take in outside air through the intake port depending on the usage state of the information processing apparatus, then the air intake efficiency may deteriorate, thus inconveniently causing the heat dissipation performance to deteriorate.

SUMMARY OF THE INVENTION

The present invention has been made in view of the above-described circumstance, and an object of the invention is to provide an information processing apparatus and a control method that suppress the deterioration of heat dissipation performance due to a usage state.

The present invention has been made to solve the above-described problem, and an information processing apparatus according to a first aspect of the present invention includes: a first chassis having a first surface provided with at least an air intake port; a second chassis which is connected to the first chassis in a relatively rotatable manner and has a second surface that overlaps the first surface of the first chassis by the rotation; a heat dissipation unit having a fan for replacing air in the first chassis with outside air through at least the air intake port; a state detection unit that detects whether a state is a first state in which the first surface and the second surface overlap; and a control unit which changes control of the fan according to whether a state is the first state.

In the above-described information processing apparatus, the control unit may perform control such that a rotation speed of the fan becomes relatively higher in the case where the state is the first state than in the case where the state is a second state, which is not the first state.

In the above-described information processing apparatus, the control unit may refer to setting information that associates a temperature with the rotation speed of the fan to control the rotation speed of the fan on the basis of a detection result of a sensor that detects a temperature in the first chassis, and in the setting information, first setting information that is referred to in the case where the state is the first state may be set such that the rotation speed of the fan at the same temperature is higher than that in second setting information that is referred to in the case where the state is the second state.

In the above-described information processing apparatus, an amount by which a sound volume generated is smaller in the case where the state is the first state than in the case where the state is the second state when the rotation speed of the fan is the same may be converted to an increase in the rotation speed, and the first setting information may be set such that the rotation speed of the fan at the same temperature is higher than that in the second setting information.

In the above-described information processing apparatus, each of the first setting information and the second setting information may be further associated with a plurality of types of setting modes related to performance of a processor.

In the above-described information processing apparatus, the first surface may have a plurality of operators arranged to accept user operations, and the air intake port may be provided corresponding to at least a part of the periphery of each of the plurality of operators.

In the above-described information processing apparatus, the state detection unit may detect whether a state is a third state in which an opposite surface of the first surface and an opposite surface of the second surface overlap due to the rotation of the first chassis and the second chassis and further detect a placement state of the information processing apparatus, and the control unit may control the rotation speed of the fan on the basis of whether the state is the third state and the placement state of the information processing apparatus.

In the above-described information processing apparatus, a plurality of operators that accept user operations may be arranged on the opposite surface of the first surface of the first chassis, and a display unit may be provided on the opposite surface of the second surface of the second chassis.

A control method in an information processing apparatus, which includes a first chassis having a first surface provided with at least an air intake port; a second chassis which is connected to the first chassis in a relatively rotatable manner and has a second surface that overlaps the first surface of the first chassis by the rotation; and a heat dissipation unit having a fan for replacing the air in the first chassis with outside air through at least the air intake port, according to a second aspect of the present invention includes a step in which a state detection unit detects whether a state is a first state in which the first surface and the second surface overlap; and a step in which a control unit changes control of the fan according to whether the state is the first state.

The above-described aspects of the present invention can suppress the deterioration of heat dissipation performance due to a usage state.

DETAILED DESCRIPTION OF THE INVENTION

The following will describe in detail the embodiments of the present invention with reference to the accompanying drawings.

First Embodiment

First, an information processing apparatus according to the present embodiment will be outlined.

[Outline of the Information Processing Apparatus]

Figure 1:
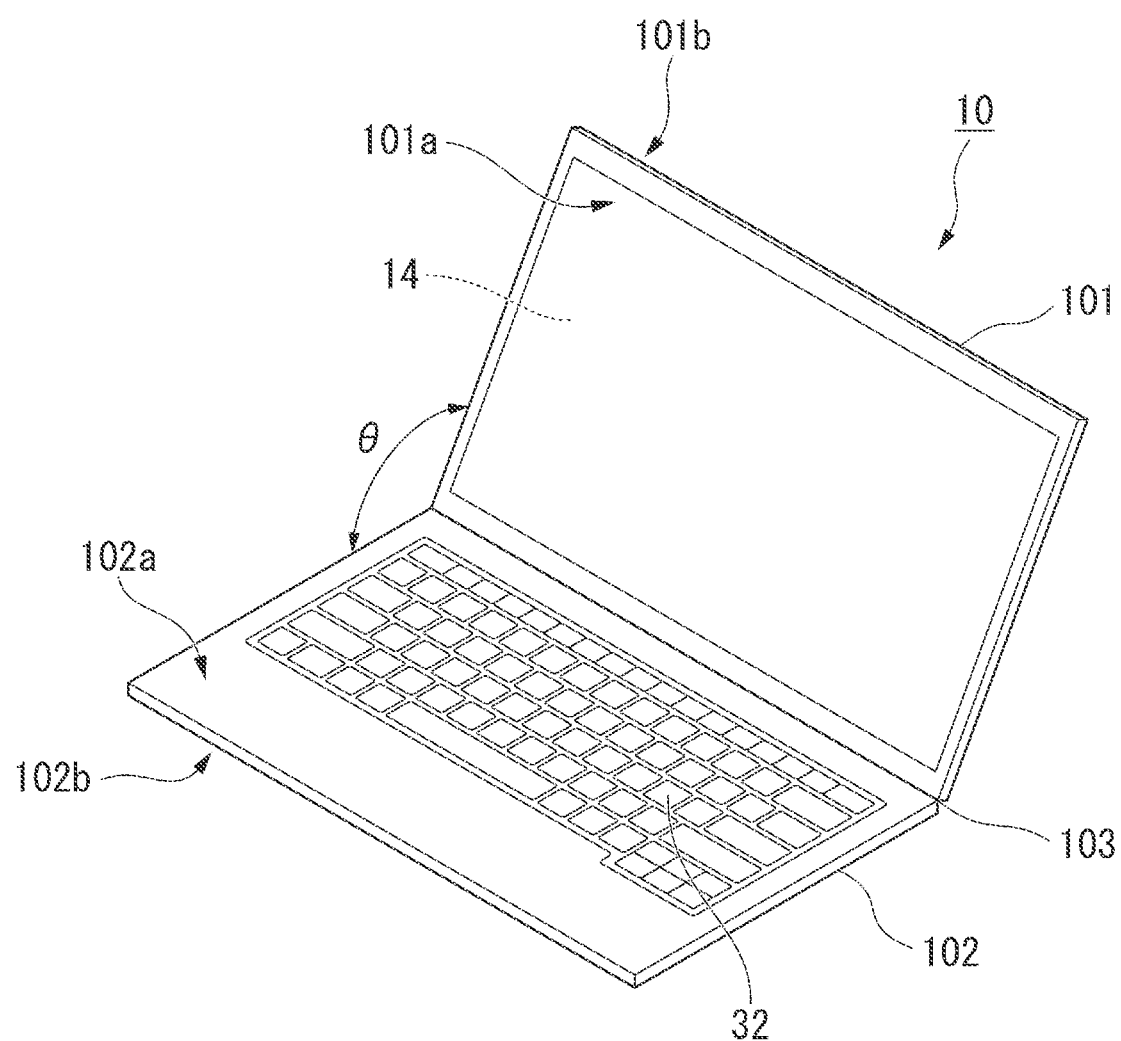
FIG. 1 is a perspective view illustrating the appearance of an information processing apparatus according to a first embodiment.

FIG. 1 is a perspective view illustrating the appearance of an information processing apparatus according to the present embodiment. An information processing apparatus 10 illustrated is a clamshell type laptop PC (Personal Computer). The information processing apparatus 10 has a display chassis 101 with a display unit 14 (display) mounted thereon, a device chassis 102 with a keyboard 32 mounted thereon, and a hinge mechanism 103. The display chassis 101 and the device chassis 102 are substantially quadrangular plate-shaped (e.g., flat plate-shaped) chassis. One of the side surfaces of the display chassis 101 and one of the side surfaces of the device chassis 102 are coupled (connected) through the intermediary of a hinge mechanism 103, and the display chassis 101 and the device chassis 102 can be rotated relative to each other around the rotation axis formed by the hinge mechanism 103. A state in which an opening angle θ around the rotation axis of the display chassis 101 and the device chassis 102 is substantially 0° is a state in which the display chassis 101 and the device chassis 102 overlap and are closed (referred to as "closed state"). A state in which the display chassis 101 and the device chassis 102 are opened with respect to the closed state will be referred to as "open state". The open state is a state in which the display chassis 101 and the device chassis 102 are relatively rotated until the opening angle θ becomes larger than a threshold value (e.g., 10°) set in advance.

The surface of the display chassis 101 on which the display unit 14 is provided will be referred to as a display surface 101a, and the surface on the opposite side from the display surface 101a will be referred to as a top surface 101b. In addition, the surface of the device chassis 102 on which the keyboard 32 is provided will be referred to as a keyboard surface 102a, and the surface on the opposite side from the keyboard surface 102a will be referred to as a bottom surface 102b. In the closed state, the display surface 101a and the keyboard surface 102a are surfaces on the sides that face each other. In the illustrated example, the keyboard 32 is a physical keyboard on which a plurality of keys (an example of operators) that accept user operations are arranged. In addition to the keyboard 32, a touch pad or the like may be provided on the keyboard surface 102a.

In the closed state, the display surface 101a of the display chassis 101 and the keyboard surface 102a of the device chassis 102 overlap, so that the display unit 14 cannot be visually recognized and the keyboard 32 cannot be operated. On the other hand, in the open state, the display unit 14 can be visually recognized and the keyboard can be operated.

Figure 2:
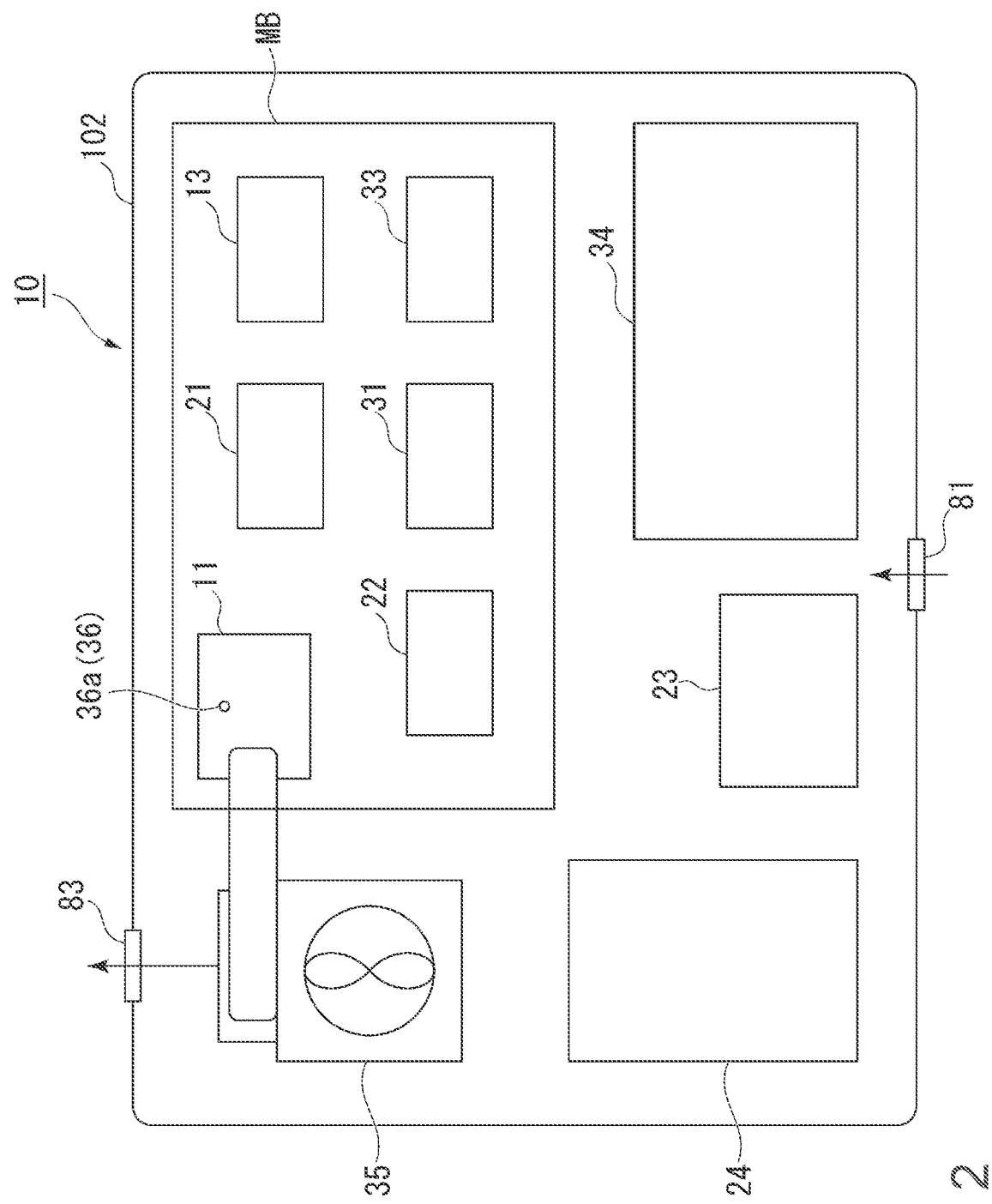
FIG. 2 is a plan view schematically illustrating the interior of a device chassis of the information processing apparatus according to the first embodiment.

FIG. 2 is a plan view schematically illustrating the interior of the device chassis 102 of the information processing apparatus 10. A motherboard MB, a storage medium 23, an audio system 24, a battery 34, and a heat dissipation fan 35 are placed inside the device chassis 102. A CPU (Central Processing Unit) 11, a video subsystem 13, a chipset 21, a BIOS (Basic Input Output System) memory 22, an embedded controller 31, a power circuit 33, and the like, for example, are mounted on the motherboard MB.

The CPU 11 may be a CPU and a GPU (Graphics Processing Unit), or any of them. The CPU 11 may be of a type in which the CPU and the GPU are formed on the same core. Further, the CPU 11 may be a type in which the CPU and the GPU are formed by separate cores to share a load. Further, there may be a plurality of CPUs 11. The higher the operating frequency, power consumption, or the like, the more heat the CPU 11 generates, thus leading to a rise in the temperature inside the device chassis 102. Other electronic devices in the device chassis 102 can also be a source of heat.

The heat dissipation fan 35 (an example of the heat dissipation unit) replaces the air in the device chassis 102 with outside air. For example, when the heat dissipation fan 35 operates and the fan (impeller) rotates, outside air enters the device chassis 102 through air intake ports 81 of the device chassis 102, exchanges heat with a heat sink (not illustrated), and is discharged through an exhaust port 83 to the outside of the device chassis 102. The heat sink is thermally coupled to the CPU 11 by a heat pipe (not illustrated) or the like. In the device chassis 102, temperature sensors 36 are located at a plurality of predetermined locations within electronic devices and the device chassis 102 where temperature control is required. For example, a temperature sensor 36a illustrated is placed to detect the temperature of the CPU 11. Other temperature sensors 36, which are not illustrated, are also placed to detect the temperature at each location in the same manner. The information processing apparatus 10 can dissipate heat inside the device chassis 102 by rotating the heat dissipation fan 35 according to the detection temperatures of the temperature sensors 36.

Figure 3:
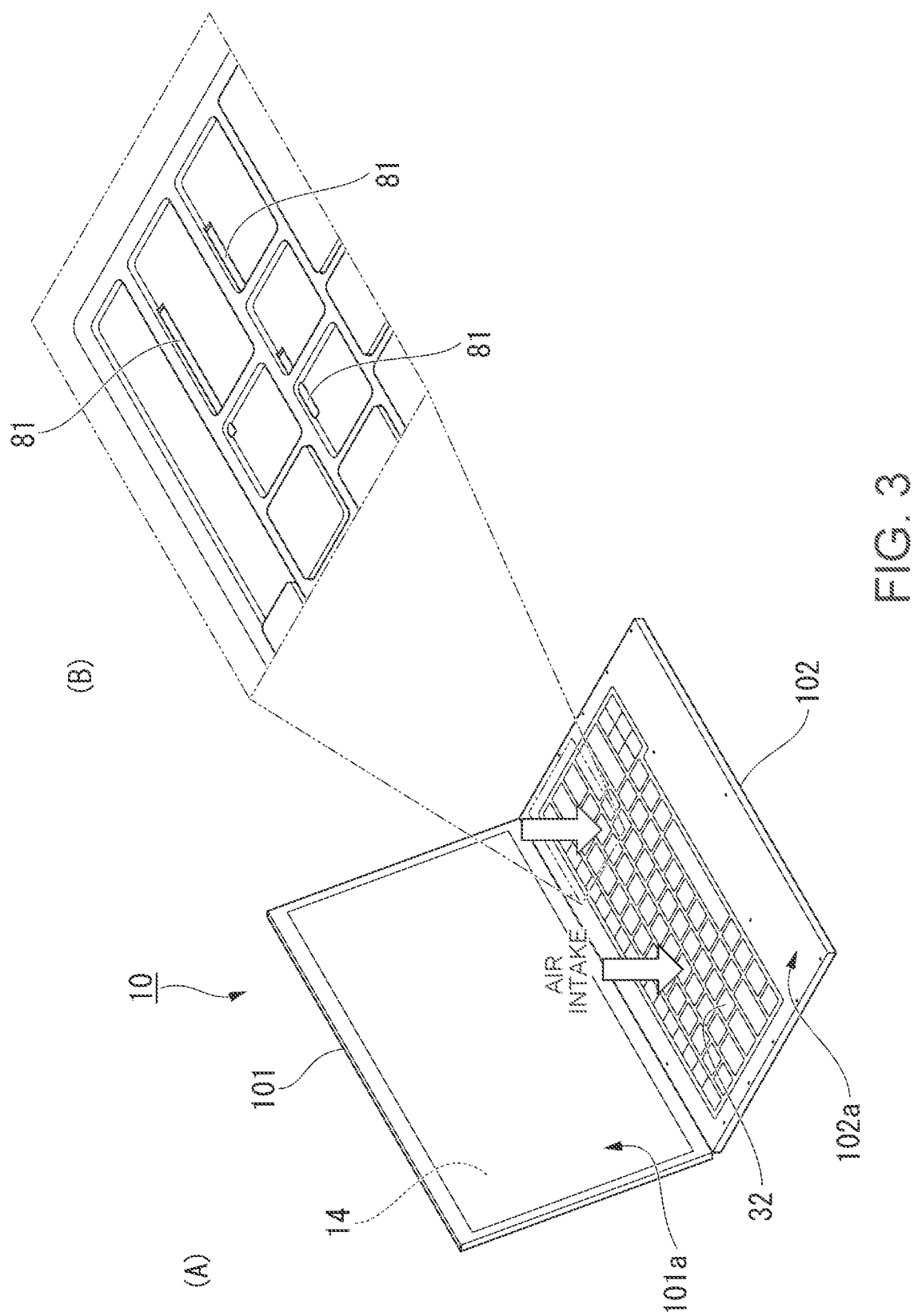
FIG. 3 are schematic views illustrating examples of the locations where air intake ports are provided according to the first embodiment.

FIG. 3 are schematic diagrams illustrating the examples of the locations where the air intake ports 81 are provided in the device chassis 102. As illustrated in FIG. 3(A), in the information processing apparatus 10, the air intake ports 81 are provided in the keyboard surface 102a of the device chassis 102, and when the heat dissipation fan 35 rotates, air is taken in (outside air is taken in) through the air intake ports 81 provided in the keyboard surface 102a. FIG. 3(B) illustrates a part of the keyboard 32 in an enlarged manner, some of the keys having been removed to show the locations of the air intake ports 81. As illustrated in these drawings, the air intake ports 81 are provided corresponding to at least a part around each of the plurality of keys arranged on the keyboard 32. For example, a plurality of the air intake ports 81 are provided in a part of the space (gap) between adjacent keys so as to correspond to recesses. The locations of the air intake ports 81 are not limited to the space between keys, and may alternatively be a location corresponding to a side where there is no adjacent key among the sides around a key provided at an edge. These air intake ports 81 cannot be visually recognized because they are on the back side of the keys when the keys are actually attached. When the heat dissipation fan 35 rotates, outside air is taken into the air intake ports 81 through the gaps between the keys.

The exhaust port 83 is provided, for example, in a portion of a side surface of the device chassis 102. The exhaust port 83 may be provided in the bottom surface 102b instead of or in addition to a side surface of the device chassis 102. Further, the air intake ports 81 may be provided not only in the keyboard surface 102a, but also in a portion of a side surface of the device chassis 102 other than the keyboard surface 102a, or in the bottom surface 102b.

The general usage state when a user uses the information processing apparatus 10 is frequently, for example, the open state in which an opening angle θ is approximately 90° to 180°. In this usage state, air intake from the keyboard surface 102a is possible. However, the information processing apparatus 10 is also used in the closed state in some cases. For example, when the information processing apparatus 10 is connected to an external monitor and used while viewing the display on the external monitor, the information processing apparatus 10 may be used in the closed state. The operation mode when the information processing apparatus 10 is switched to the closed state from a state in which the information processing apparatus 10 is being used in a normal operation mode in the open state can be selected and set by the user from among "Do nothing," "Sleep," "Hibernate," "Shutdown," and the like by, for example, OS setting. For example, if "Do nothing" is set, then the information processing apparatus 10 can be used as it is in the normal operation mode even after the state is changed from the open state to the closed state.

In the case where the information processing apparatus 10 is being used in the closed state, the keyboard surface 102a is covered with the display surface 101a of the display chassis 101, making it difficult to take in outside air through the intake ports 81. Therefore, in the closed state, even if the heat dissipation fan 35 is rotated as in the open state, the air intake efficiency may drop and the heat dissipation performance may deteriorate. On the other hand, the sound (noise) generated when the heat dissipation fan 35 is rotated is smaller in the closed state than in the open state. This is because the keyboard surface 102a is covered with the display surface 101a of the display chassis 101, so that the sound leaking from the device chassis 102 and the resonance of the sound are reduced.

Therefore, in the closed state, the level of the sound (noise) generated when the heat dissipation fan 35 is rotated is reduced as compared with that in the open state, so that the information processing apparatus 10 controls the rotation speed (the number of rotations per unit time) of the heat dissipation fan 35 to increase until reaching approximately the same level. This control suppresses the deterioration of the heat dissipation performance in the closed state.

[Outline of the Heat Dissipation Control]

Figure 4:
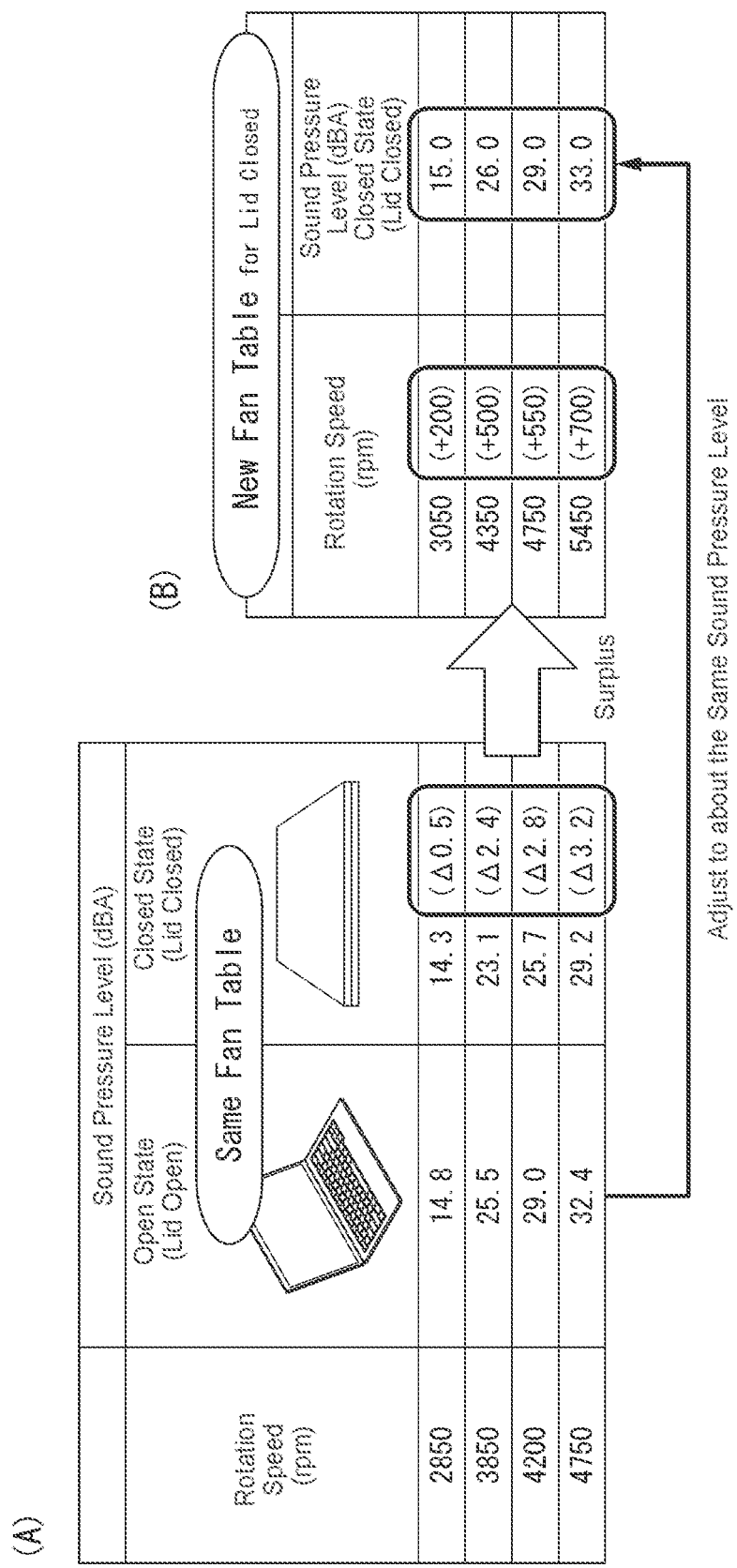
FIG. 4 are explanatory diagrams of heat dissipation control according to the first embodiment.

Referring to FIG. 4, the concept of the heat dissipation control in which the rotation speed of the heat dissipation fan 35 is changed between the closed state and the open state of the information processing apparatus 10 will be specifically described. FIGS. 4(A)-4(B) present explanatory diagrams illustrating the heat dissipation control according to the present embodiment. The diagrams illustrate the examples of the relationship between the rotation speed (rpm) of the heat dissipation fan 35 and the sound pressure level (dBA) in the open state (Lid Open) and the closed state (Lid Closed). FIG. 4(A) illustrates an example of the measurement results of the sound pressure level when the same fan table was used to control the rotation speed to the same rotation speed for the open state and the closed state. The fan table is a data table in which control information such as the start of rotation, the stop of rotation, and the rotation speed of the heat dissipation fan 35 is set. If the fan table is the same, the heat dissipation fan 35 is controlled to the same rotation speed under the same conditions.

In the example illustrated in FIG. 4(A), the sound pressure level when the rotation speed is 2850 rpm is 14.8 dBA in the open state and 14.3 dBA in the closed state. The sound pressure level is 0.5 dBA lower in the closed state than in the open state. The sound pressure level when the rotation speed is 3850 rpm is 25.5 dBA in the open state and 23.1 dBA in the closed state. The sound pressure level is 2.4 dBA lower in the closed state than in the open state. The sound pressure level when the rotation speed is 4200 rpm is 29.0 dBA in the open state and 25.7 dBA in the closed state. The sound pressure level is 2.8 dBA lower in the closed state than in the open state. The sound pressure level when the rotation speed is 4750 rpm is 32.4 dBA in the open state and 29.2 dBA in the closed state. The sound pressure level is 3.2 dBA lower in the closed state than in the open state.

The amount by which the sound pressure level is lower in the closed state than in the open state at the same rotation speed is a surplus, so that the surplus is converted to an increase in the rotation speed and an adjustment is made so as to reach approximately the same sound pressure level. FIG. 4(B) illustrates an example of the measurement results of the sound pressure level when a new fan table different from the fan table for the open state is used as the fan table for the closed state.

Whereas the sound pressure level was 14.8 dBA at a rotation speed of 2850 rpm in the open state, even when the rotation speed is increased to 3050 rpm (+200 rpm) in the closed state, the sound pressure level is 15.0 dBA, which is almost equal to the sound pressure level of 14.8 dBA in the open state. Similarly, whereas the sound pressure level was 25.5 dBA when the rotation speed was 3850 rpm in the open state, even when the rotation speed is increased to 4350 rpm (+500 rpm), the sound pressure level is 26.0 dBA in the closed state, which is almost equivalent to the sound pressure level of 25.5 dBA in the open state.

The information processing apparatus 10 according to the present embodiment converts the amount by which the sound pressure level is lower in the closed state than in the open state to a rotation speed to perform the heat dissipation control using the fan tables in which the rotation speeds are set higher in the closed state than in the open state such that approximately the same sound pressure level is reached in the closed state and the open state. The following will describe in detail the configuration of the information processing apparatus 10.

[Hardware Configuration of the Information Processing Apparatus 10]

Figure 5:
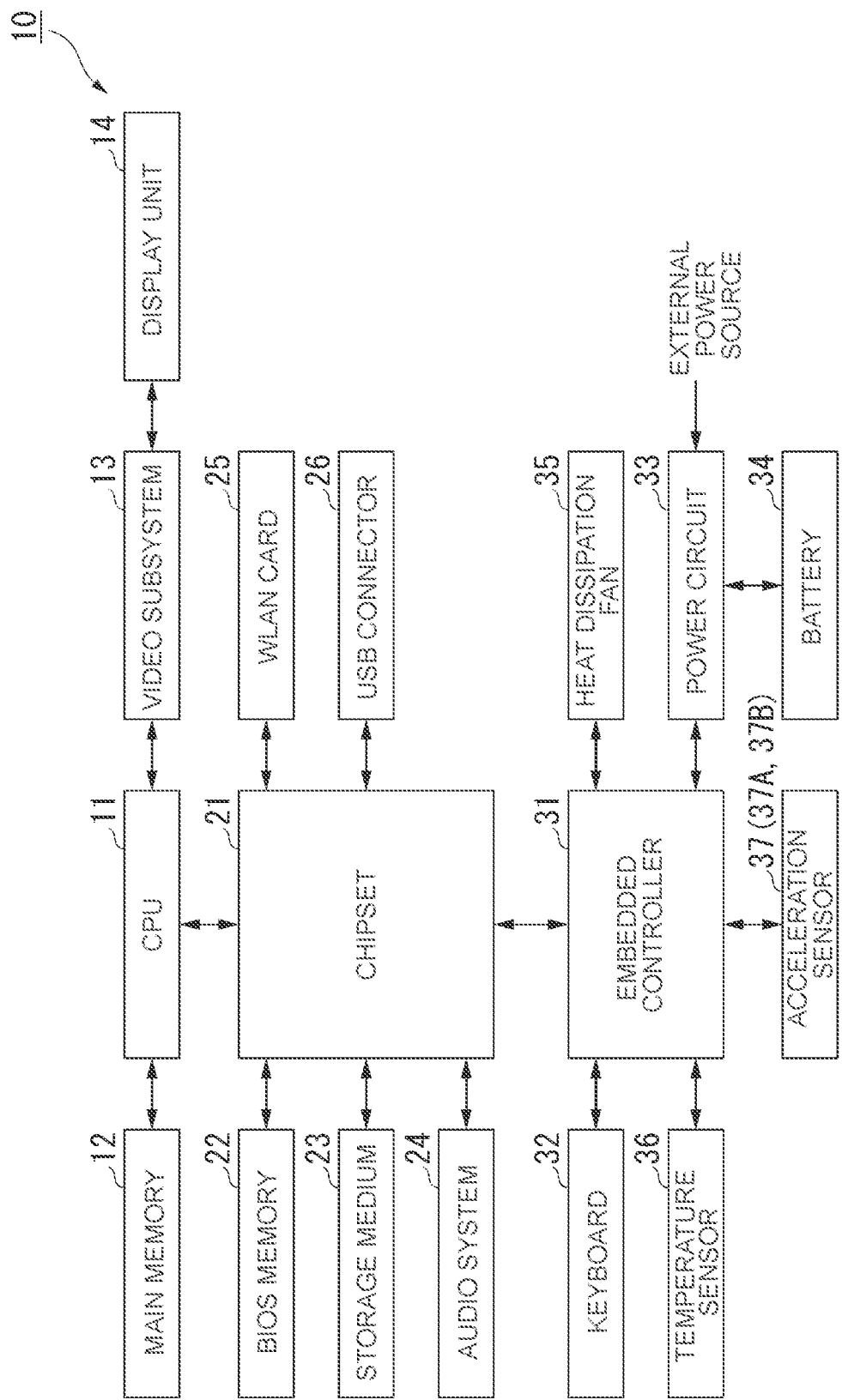
FIG. 5 is a block diagram illustrating an example of the hardware configuration of the information processing apparatus according to the first embodiment.

Referring now to FIG. 5, the major hardware configuration of the information processing apparatus 10 will be described. FIG. 5 is a block diagram illustrating an example of the hardware configuration of the information processing apparatus 10.

The information processing apparatus 10 includes the CPU 11, a main memory 12, the video subsystem 13, the display unit 14, the chipset 21, the BIOS memory 22, the storage medium 23, the audio system 24, a WLAN card 25, a USB connector 26, the embedded controller 31, the keyboard 32, the power circuit 33, the battery 34, the heat dissipation fan 35, the temperature sensors 36, and acceleration sensors 37.

The CPU 11 performs various types of arithmetic processing under program control to control the entire information processing apparatus 10. For example, the CPU 11 performs processing based on an OS (Operating System) or a BIOS program.

The main memory 12 is a writable memory that is used as an area for reading an executable program of the CPU 11 or as a work area for writing the processing data of an executable program. The main memory 12 is composed of, for example, a plurality of DRAM (Dynamic Random Access Memory) chips. The executable program includes an OS, various drivers for hardware operation of peripheral devices, various services/utilities, application programs, and the like.

The video subsystem 13 is a subsystem for implementing functions related to image display, and includes a video controller. The video controller processes drawing instructions from the CPU 11, writes the processed drawing information to a video memory, reads the drawing information from the video memory, and outputs the read drawing information as drawing data (display data) to the display unit 14.

The display unit 14 is, for example, a liquid crystal display or an organic EL display, and displays a display screen based on the drawing data (display data) output from the video subsystem 13.

The chipset 21 includes controllers such as a USB (Universal Serial Bus), a serial ATA (AT Attachment), an SPI (Serial Peripheral Interface) bus, a PCI (Peripheral Component Interconnect) bus, a PCI (Peripheral Component Internet) bus, a PCI-Express bus, and an LPC (Low Pin Count) bus, and has a plurality of devices connected thereto. For example, the plurality of devices include the BIOS memory 22, the storage media 23, the audio system 24, the WLAN card 25, the USB connector 26, and the embedded controller 31, which will be described below.

The BIOS memory 22 is composed of, for example, an electrically rewritable non-volatile memory such as an EEPROM (Electrically Erasable Programmable Read Only Memory) or a flash ROM. The BIOS memory 22 stores a BIOS and system firmware for controlling the embedded controller 31 and the like.

The storage medium 23 is configured by including an HDD (Hard Disk Drive), an SSD (Solid State Drive), and the like. For example, the storage medium 23 stores an OS, various drivers, various services/utilities, application programs, and various data.

The audio system 24 has a microphone and a speaker (not illustrated) connected thereto, and records, reproduces and outputs sound data. The microphone and the speaker are, for example, built into the information processing apparatus 10.

The WLAN (Wireless Local Area Network) card 25 connects to a network via a wireless (radio-frequency) LAN to perform data communication. When, for example, data is received from a network, the WLAN card 25 generates an event trigger that indicates that the data has been received.

The USB connector 26 is a connector for connecting peripheral devices using USBs.

The keyboard 32 is an input device in which a plurality of keys (an example of operators) are arranged to accept user operations. As illustrated in FIG. 1, the keyboard 32 is provided on the keyboard surface 102a of the device chassis 102. The keyboard 32 outputs input information (e.g., operation signals indicating keys that have been operated on the keyboard) input by user operations to the embedded controller 31.

The power circuit 33 is configured by including, for example, a DC/DC converter, a charge/discharge unit, an AC/DC adaptor, and the like. For example, the power circuit 33 converts a DC voltage supplied from an external power source such as an AC adapter (not illustrated) or the battery 34 into a plurality of voltages required to operate the information processing apparatus 10. Further, the power circuit 33 supplies power to each section of the information processing apparatus 10 according to the control from the embedded controller 31.

The battery 34 is, for example, a lithium battery, and is charged through the power circuit 33 when power is supplied to the information processing apparatus 10 from an external power source, and outputs charged power as operating power of the information processing apparatus 10 through the intermediary of the power circuit 33 when power is not being supplied to the information processing apparatus 10 from an external power source.

The acceleration sensors 37 include an acceleration sensor 37A provided inside the display chassis 101 and an acceleration sensor 37B provided inside the device chassis 102. The information processing apparatus 10 uses the detection results of the two acceleration sensors 37 (37A and 37B) to detect the opening angle θ between the display chassis 101 and the device chassis 102. For example, the information processing apparatus 10 can detect the opening angle θ by estimating the directions (attitudes) of the display chassis 101 and the device chassis 102 on the basis of a detection signal output from the acceleration sensor 37A and a detection signal output from the acceleration sensor 37B.

The embedded controller 31 is a one-chip microcomputer that monitors and controls various devices (peripheral devices, sensors, and the like) regardless of the state of the system of the information processing apparatus 10. The embedded controller 31 includes a CPU, a ROM, a RAM, an A/D input terminal of a plurality of channels, a D/A output terminal, a timer, and digital I/O terminals, which are not illustrated. Connected to the digital I/O terminals of the embedded controller 31 are, for example, the keyboard 32, the power circuit 33, the heat dissipation fan 35, the temperature sensors 36, the acceleration sensors 37, and the like. The embedded controller 31 receives input information (operation signals) from the keyboard 32, and sensor signals from the temperature sensors 36, the acceleration sensors 37, and the like. Further, the embedded controller 31 controls the operations of the power circuit 33, the heat dissipation fan 35, and the like.

For example, the embedded controller 31 acquires the detection results (detected temperatures) of the temperature sensors 36, and controls the heat dissipation fan 35 on the basis of the detection results. Further, the embedded controller 31 detects whether the state is the open state or the closed state on the basis of the detection results of the acceleration sensors 37, and performs heat dissipation control to change the rotation speed of the heat dissipation fan 35 according to whether the state is the open state or the closed state.

[Functional Configuration of the Information Processing Apparatus 10]

Figure 6:
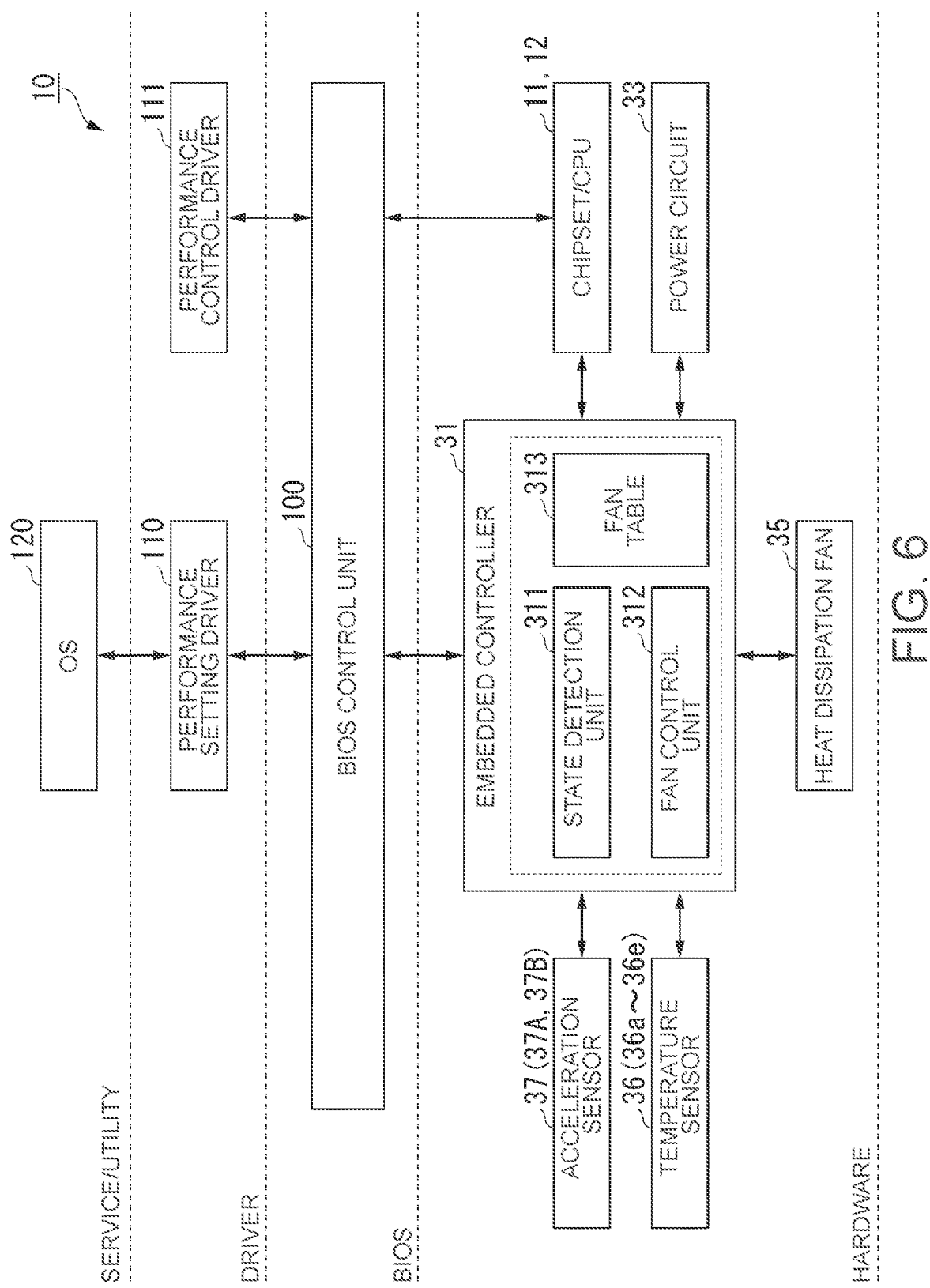
FIG. 6 is a block diagram illustrating an example of the functional configuration of the information processing apparatus according to the first embodiment.

FIG. 6 is a block diagram illustrating an example of the functional configuration of the information processing apparatus 10 according to the present embodiment. The information processing apparatus 10 includes, as functional constituents, a BIOS control unit 100, a performance setting driver 110, a performance control driver 111, an OS 120, a state detection unit 311, a fan control unit 312, and a fan table 313.

Referring to FIG. 6, the service/utility, the drivers, and the BIOS are implemented by, for example, the CPU 11 reading the programs of the OS, the drivers, and the BIOS stored in the storage medium 23 or the BIOS memory 22 into the main memory 12, and executing the read programs. Here, the BIOS control unit 100 corresponds to the BIOS, the performance setting driver 110 and the performance control driver 111 correspond to the drivers, and the OS 120 corresponds to the service/utility. Further, the state detection unit 311, the fan control unit 312, and the fan table 313 are functional constituents implemented by the embedded controller 31 executing the programs stored in an internal ROM.

The OS 120 executes an OS and applications that run on the OS, and the processing of utility software and the like included in the OS. For example, the OS 120 notifies the performance setting driver 110 of the thermal control setting information of the information processing apparatus 10 in response to a user operation or the like. The thermal control is adapted to control the operation of the CPU 11 and the rotation of the heat dissipation fan 35 thereby to suppress a temperature rise of the information processing apparatus 10. For example, the setting modes of the thermal control include "Quiet mode," "Balance mode," "Performance mode," and the like. From among the above setting modes, a user can select any setting mode. The thermal control setting information includes information indicating a setting mode selected from among the above setting modes.

The Quiet mode is a mode in which, in order to prioritize quietness over the performance of processing by the CPU 11, the power consumption and the operating frequency of the CPU 11 are decreased prior to increasing the rotation speed of the heat dissipation fan 35 when the temperature rises.

The Performance mode is a mode in which, in order to prioritize performance over quietness, the rotation speed of the heat dissipation fan 35 is first increased to the settable upper limit speed thereof when the temperature rises. If, even after controlling the rotation speed of the heat dissipation fan 35 as described above, a detected temperature rises further, then the power consumption or the operating frequency of the CPU 11 is reduced.

The Balance mode is a mode adjusted to take advantage of both the quietness of the Quiet mode and the performance of the Performance mode, and is a mode controlled between the Quiet mode and the Performance mode.

When the performance setting driver 110 acquires the thermal control setting information (Quiet mode/Balance mode/Performance mode) from the OS 120, the performance setting driver 110 notifies a BIOS control unit 100 of the acquired setting information.

In response to an instruction from the BIOS control unit 100, the performance control driver 111 sets a parameter related to the performance of the CPU 11. Parameters related to the performance include, for example, the setting of the upper limit of the consumption power of the CPU 11, the setting of the upper limit of the operating frequency of the CPU 11, and the like. For example, the performance control driver 111 has set values of parameters related to the performance of the CPU 11 that are associated with each of the Quiet mode, the Balance mode, the Performance mode, and the like. Then, when the performance control driver 111 acquires the mode setting information instructing the setting to one of the Quiet mode, the Balance mode, and the Performance mode from the BIOS control unit 100, the performance control driver 111 sets the parameters such that the CPU 11 operates in the set mode indicated in the acquired mode setting information.

The state detection unit 311 acquires detection signals output from the acceleration sensors 37 (37A and 37B), and detects whether the information processing apparatus 10 is in the closed state on the basis of the acquired detection signals. For example, the state detection unit 311 determines the opening angle θ between the display chassis 101 and the device chassis 102 on the basis of the detection signals of the acceleration sensors 37 (37A and 37B), and determines that the information processing apparatus 10 is in the closed state if the opening angle θ is below a first threshold value set in advance. On the other hand, the state detection unit 311 determines that the information processing apparatus 10 is in the open state if the opening angle θ is equal to or more than a second threshold value set in advance. The first threshold value is a threshold value for determining that the state has been changed from the open state to the closed state. The second threshold value is a threshold value for determining that the state has changed from the closed state to the open state. The second threshold value is set to a value larger than the first threshold value, and a hysteresis characteristic is provided for determining the open state and the closed state. As an example, the first threshold value may be set to 5° and the second threshold value may be set to 10°. The state detection unit 311 outputs the state detection information indicating that the state is the open state or the closed state to the BIOS control unit 100.

In the present embodiment, the description has been given of the configuration example, in which the acceleration sensors 37 (37A and 37B) are used to detect whether the state is the closed state; however, the present invention is not limited thereto. For example, a gyro sensor, a tilt sensor, a geomagnetic sensor, or the like may be used in place of or in addition to the acceleration sensors 37. Further, a Hall sensor may be used to detect whether the state is the closed state. For example, a magnet on the display chassis 101 side and a Hall sensor on the device chassis 102 side may be provided at corresponding positions, and the state detection unit 311 may detect whether the state is the closed state according to a detection signal of the Hall sensor based on a magnetic field that changes between the open state and the closed state.

The fan control unit 312 controls the operation of the heat dissipation fan 35 according to the detection results (detected temperatures) of the temperature sensors (36a to 36e). For example, the fan control unit 312 refers to the fan table 313 to control the heat dissipation fan 35 on the basis of the rotation start, the rotation stop, the rotation speed, and the like of the heat dissipation fan 35 set on the basis of the temperature inside the device chassis 102. The fan table 313 is a data table (setting information) in which information for controlling the rotation start, the rotation stop, the rotation speed, and the like of the heat dissipation fan 35 has been set. The fan table 313 is stored in, for example, the memory in the embedded controller 31.

Figure 7A:
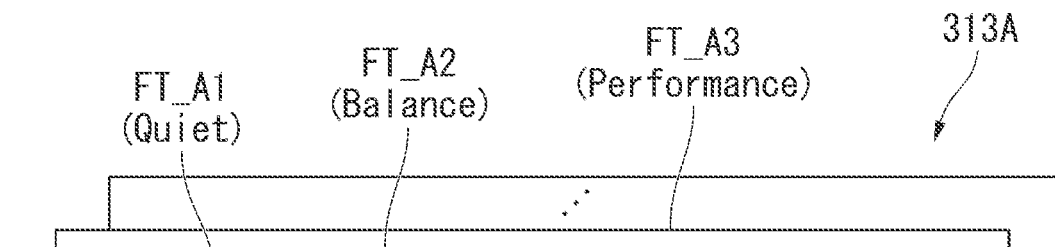
FIGS. 7A-7B present diagrams illustrating examples of fan tables according to the first embodiment.
Figure 7B:

FIGS. 7A and 7B are diagrams illustrating an example of the fan table 313 according to the present embodiment. The fan table 313 includes a fan control table 313A (refer to FIG. 7A) that specifies the set temperatures for controlling the rotation of the heat dissipation fan 35, and a fan rotation speed table 313B (refer to FIG. 7B) that specifies the rotation speeds. In the fan control table 313A illustrated in FIG. 7A, set temperatures to control the rotation of the heat dissipation fan 35 for each of the temperature sensors 36 (36a to 36e) are associated as setting information for controlling the rotation of the heat dissipation fan 35. For example, for each of the temperature sensors 36 (36a to 36e) placed at a plurality of predetermined positions in the device chassis 102 of the information processing apparatus 10, set temperature values (threshold values) for changing the operating state of the heat dissipation fan 35 in four speed steps, namely, stop, low-speed rotation, medium-speed rotation, and high-speed rotation, are stored. The set temperatures are composed of enable temperatures LTe, MTe, and HTe and disable temperatures LTd, MTd, and HTd for each operating state, and a hysteresis characteristic is provided between the case where the rotation speed changes in an upward direction and the case where the rotation speed changes in a downward direction.

The enable temperatures LTe, MTe, and HTe for the low-speed rotation, the medium-speed rotation, and the high-speed rotation, respectively, are the temperatures at which the rotation speed shifts from a speed step that is one step slower to the relevant speed step when the measured temperature of a temperature sensor is in an upward trend. The disable temperatures LTd, MTd, and HTd for the low-speed rotation, the medium-speed rotation, and the high-speed rotation, respectively, are the temperatures at which the rotation speed shifts to a speed step that is one step slower than the relevant speed step when the measured temperature of a temperature sensor is in a downward trend. Here, the speed step that is slower than the above low-speed rotation is a stop state.

For example, the fan control unit 312 starts the rotation of the heat dissipation fan 35 when the measured temperature of any one of the temperature sensors 36a to 36e reaches the enable temperature LTe, and increases the rotation speed by one step when the measured temperature of any one of the temperature sensors 36a to 36e reaches the enable temperature MTe or HTe. Further, the fan control unit 312 lowers the rotation speed of the heat dissipation fan 35 by one step when the measured temperatures of all the temperature sensors 36a to 36e decrease below the disable temperature MTd or HTd, and stops the rotation when the measured temperatures of all the temperature sensors 36a to 36e decrease below the disable temperature LTd.

As the rotation speed of the heat dissipation fan 35 increases, the frictional noise of air when passing through the exhaust port 83 becomes louder. For example, when the temperature of the CPU 11 increases, the rotation speed of the heat dissipation fan 35 increases accordingly, and the sound pressure level of the sound generated increases.

Further, the fan control table 313A includes a table that stores different setting information (set temperature to control the rotation of the heat dissipation fan 35) for each thermal control setting mode (Quiet mode/Balance mode/Performance mode). The example illustrated in FIG. 7A includes a fan control table FT_A1 for the Quiet mode, a fan control table FT_A2 for the Balance mode, and a fan control table FT_A3 for the Performance mode.

The fan rotation speed table 313B illustrated in FIG. 7B stores the setting information of the rotation speed for the open state (second setting information) and the setting information of the rotation speed for the closed state (first setting information) as the setting information of the rotation speed of the heat dissipation fan 35. In the illustrated example, the low-speed rotation for the open state is set to 2850 rpm, and the low-speed rotation for the closed state is set to 3050 rpm. The medium-speed rotation for the open state is set to 3850 rpm, and the medium-speed rotation for the closed state is set to 4350 rpm. The high-speed rotation for the open state is set to 4750 rpm and the high-speed rotation in the closed state is set to 5450 rpm.

As described with reference to FIGS. 4(A)-4(B), these settings are made such that the rotation speed of the heat dissipation fan 35 is relatively higher in the closed state than in the open state in each of the low-speed rotation, the medium-speed rotation, and the high-speed rotation. For example, using the fact that the sound volume (sound pressure level) generated when the rotation speed is the same is smaller in the closed state than in the open state, the amount by which the sound volume is smaller is converted to an increase in the rotation speed, and the setting information of the rotation speed for the closed state is set such that the rotation speed of the heat dissipation fan at the same temperature is higher than the setting information of the rotation speed for the open state.

Which table is to be referred to when performing the rotation control of the heat dissipation fan 35 is determined by an instruction of the BIOS control unit 100.

Although the temperature sensors 36a to 36e are illustrated here as examples of the plurality of temperature sensors 36, the number of examples of the temperature sensors 36 can be any number. Further, although the rotation speed of the heat dissipation fan 35 is set to three types, namely, the high-speed rotation, the medium-speed rotation, and the low-speed rotation, the rotation speed may be one type or two types, or four or more types.

Returning to FIG. 6, the BIOS control unit 100 acquires the thermal control setting information (Quiet mode/Balance mode/Performance mode) from the performance setting driver 110. Then, the BIOS control unit 100 performs the thermal control based on the acquired setting information. For example, the BIOS control unit 100 notifies the performance control driver 111 of the mode setting information that instructs the setting to a mode selected from among the Quiet mode, the Balance mode, and the Performance mode on the basis of the acquired thermal control setting information. In addition, the BIOS control unit 100 outputs, to the embedded controller 31, the fan mode setting information indicating an instruction to refer to the fan table (one of the fan control tables 313A of FIG. 7A) of the mode selected from among the Quiet mode, the Balance mode, and the Performance mode.

Further, the BIOS control unit 100 changes the control of the heat dissipation fan 35 according to whether the state is the open state or the closed state. For example, the BIOS control unit 100 acquires the state detection information which is output from the state detection unit 311 and which indicates whether the state is the open state or the closed state. Then, based on the acquired state detection information, the BIOS control unit 100 outputs, to the embedded controller 31, the fan rotation speed setting information indicating an instruction on which setting information is to be referred to between the setting information of the rotation speed for the open state and the setting information of the rotation speed for the closed state. More specifically, if the state is the open state, then the BIOS control unit 100 outputs the fan rotation speed setting information indicating an instruction to refer to the setting information of the rotation speed for the open state in the fan rotation speed table 313B illustrated in FIG. 7B. On the other hand, if the state is the closed state, the BIOS control unit 100 outputs the fan rotation speed setting information indicating an instruction to refer to the setting information of the rotation speed for the closed state in the fan rotation speed table 313B illustrated in FIG. 7B.

Based on the fan mode setting information and the rotation speed setting information output to the embedded controller 31 from the BIOS control unit 100, the fan control unit 312 refers to the fan control table 313A and the fan rotation speed table 313B, and controls the heat dissipation fan 35. More specifically, based on the setting modes (Quiet mode/Balance mode/Performance mode) indicated in the fan mode setting information, the fan control unit 312 controls the heat dissipation fan 35 by referring to a fan control table FT_A1 of the Quiet mode when the mode has been set to the Quiet mode, or a fan control table FT_A2 of the Balance mode when the mode has been set to the Balance mode, or a fan control table FT_A3 of the Performance mode when the mode has been set to the Performance mode. Further, based on the fan rotation speed setting information, the fan control unit 312 controls the heat dissipation fan 35 by referring to the setting information of the rotation speed for the open state in the fan rotation speed table 313B when the state is the open state, or the setting information of the rotation speed for the closed state in the fan rotation speed table 313B when the state is the closed state.

In other words, the fan control unit 312 (an example of a control unit) performs control such that the rotation speed of the heat dissipation fan 35 is relatively higher in the closed state than in the open state. For example, the fan control unit 312 refers to the fan tables 313 (the fan control table 313A and the fan rotation speed table 313B), in which the temperature in the device chassis 102 is associated with the rotation start, the rotation stop, the rotation speed, and the like of the heat dissipation fan 35, and controls the rotation speed of the heat dissipation fan 35 according to the detections results of the temperature sensors 36, which detect the temperature in the device chassis 102.

[Fan Rotation Speed Setting Operation]

Figure 8:
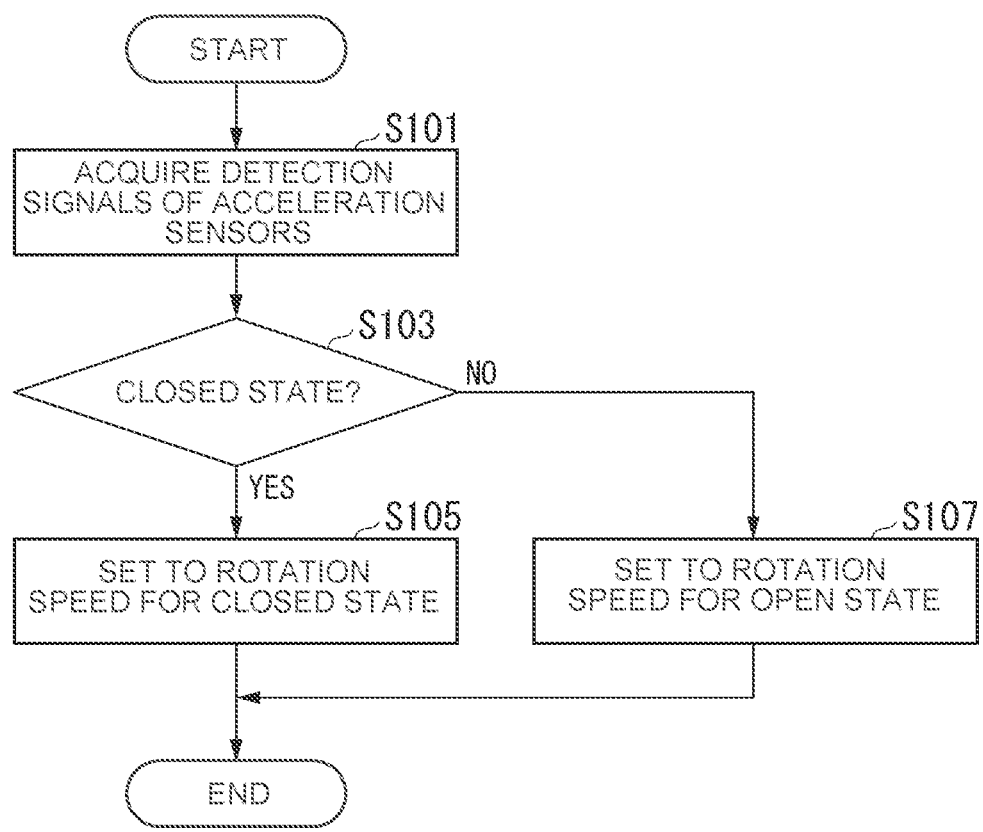
FIG. 8 is a flowchart illustrating an example of fan rotation speed setting according to the first embodiment.

Referring now to FIG. 8, a description will be given of the fan rotation speed setting operation for setting the rotation speed of the heat dissipation fan 35 according to whether the information processing apparatus 10 is in the open state or the closed state. FIG. 8 is a flowchart illustrating an example of the fan rotation speed setting according to the present embodiment.

(Step S101) When the state detection unit 311 acquires a detection signal output from the acceleration sensors 37, the state detection unit 311 proceeds to the processing of step S103.

(Step S103) The state detection unit 311 determines whether the information processing apparatus 10 is in the closed state on the basis of detection signals from the acceleration sensors 37 acquired in step S101. If the state detection unit 311 determines that the state is the closed state (YES), then the state detection unit 311 outputs state detection information indicating the closed state to the BIOS control unit 100, and proceeds to the processing of step S105. On the other hand, if the state detection unit 311 determines that the state is not the closed state (i.e., the open state instead) (NO), then the state detection unit 311 outputs state detection information indicating the open state to the BIOS control unit 100, and proceeds to the processing of step S107.

(Step S105) When the BIOS control unit 100 acquires the state detection information indicating the closed state from the state detection unit 311, the BIOS control unit 100 sets the rotation speed for the closed state. More specifically, the BIOS control unit 100 outputs, to the embedded controller 31 (the fan control unit 312), the fan rotation speed setting information indicating an instruction to refer to the setting information of the rotation speed for the closed state. This causes the fan control unit 312 to refer to the setting information of the rotation speed for the closed state in the fan rotation speed table 313B (refer to FIG. 7B) when controlling the heat dissipation fan 35.

(Step S107) When the BIOS control unit 100 acquires the state detection information indicating the open state from the state detection unit 311, the BIOS control unit 100 sets the rotation speed for the open state. More specifically, the BIOS control unit 100 outputs the fan rotation speed setting information which indicates the instruction to refer to the setting information of the rotation speed for the open state to the embedded controller 31 (the fan control unit 312). Thus, the fan control unit 312 refers to the setting information of the rotation speed for the open state in the fan rotation speed table 313B (refer to FIG. 7B) when controlling the heat dissipation fan 35.

[Fan Mode Setting Operation]

Figure 9:
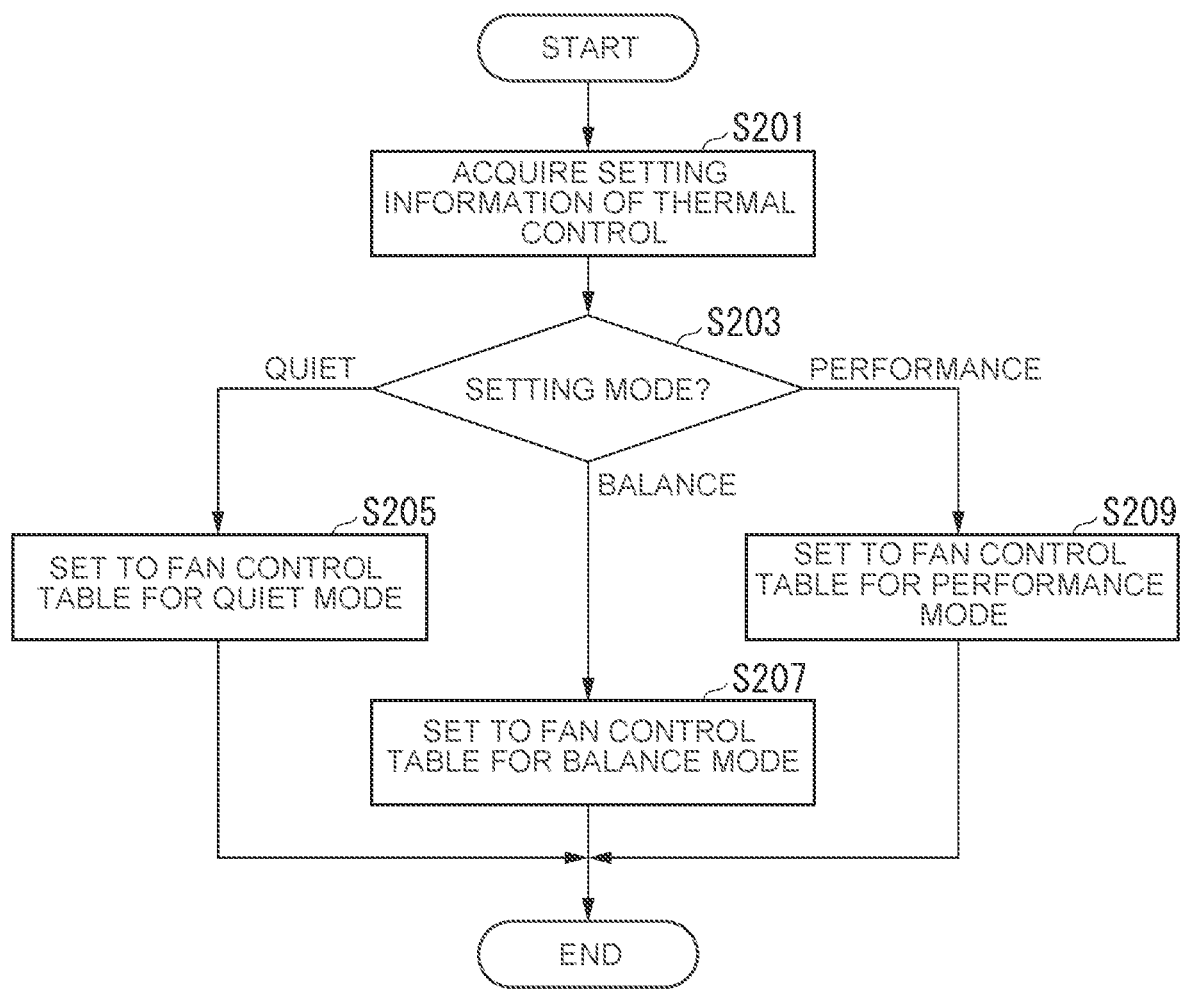
FIG. 9 is a flowchart illustrating an example of fan mode setting according to the first embodiment.

Referring now to FIG. 9, a description will be given of the fan mode setting operation for setting the setting information when the information processing apparatus 10 controls the heat dissipation fan 35 according to the setting information (setting mode) of the thermal control. FIG. 9 is a flowchart illustrating an example of the fan mode setting according to the present embodiment.

(Step S201) When the BIOS control unit 100 acquires the thermal control setting information (Quiet mode/Balance mode/Performance mode) from the performance setting driver 110, the BIOS control unit 100 proceeds to the processing of step S203. For example, when one of the Quiet mode, the Balance mode, and the Performance mode is selected by a user operation or the like, the BIOS control unit 100 acquires the thermal control setting information through the OS 120 and the performance setting driver 110.

(Step S203) Based on the acquired thermal control setting information, the BIOS control unit 100 determines which one of the Quiet mode, the Balance mode, and the Performance mode is the selected thermal control setting mode. If the selected mode is the Quiet mode, then the BIOS control unit 100 proceeds to the processing of step S205, or if the selected mode is the Balance mode, then the BIOS control unit 100 proceeds to the processing of S207, or if the selected mode is the Performance mode, then the BIOS control unit 100 proceeds to the processing of S208.

(Step S205) If the BIOS control unit 100 determines that the Quiet mode has been selected, then the fan control table FT_A1 of the Quiet mode (refer to the fan control table 313A of FIG. 7A) is set. More specifically, the BIOS control unit 100 outputs the fan mode setting information which indicates the instruction to refer to the fan control table FT_A1 of the Quiet mode to the embedded controller 31 (the fan control unit 312). Thus, the fan control unit 312 refers to the fan control table FT_A1 of the Quiet mode when controlling the heat dissipation fan 35.

(Step S207) If the BIOS control unit 100 determines that the Balance mode has been selected, then the fan control table FT_A2 of the Balance mode (refer to the fan control table 313A of FIG. 7A) is set. More specifically, the BIOS control unit 100 outputs the fan mode setting information which indicates the instruction to refer to the fan control table FT_A2 of the Balance mode to the embedded controller 31 (the fan control unit 312). Thus, the fan control unit 312 refers to the fan control table FT_A2 of the Balance mode when controlling the heat dissipation fan 35.

(Step S209) If the BIOS control unit 100 determines that the Performance mode has been selected, then the fan control table FT_A3 of the Performance mode (refer to the fan control table 313A of FIG. 7A) is set. More specifically, the BIOS control unit 100 outputs the fan mode setting information which indicates the instruction to refer to the fan control table FT_A3 of the Performance mode to the embedded controller 31 (the fan control unit 312). Thus, the fan control unit 312 refers to the fan control table FT_A3 of the Performance mode when controlling the heat dissipation fan 35.

[Fan Controlling Operation]

Figure 10:
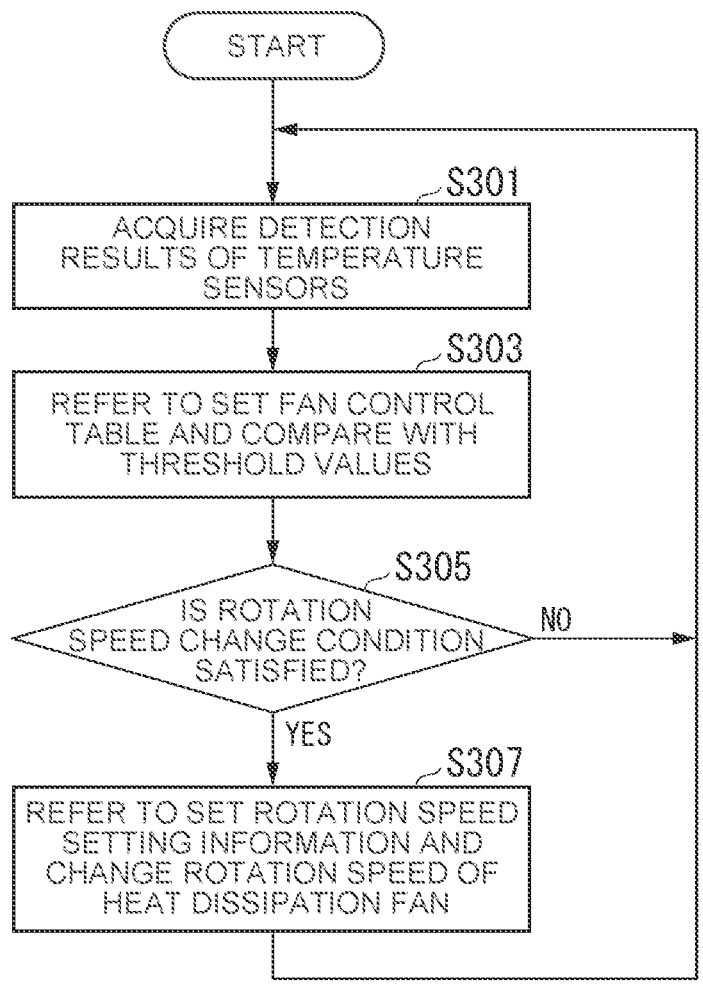
FIG. 10 is a flowchart illustrating an example of fan control processing according to the first embodiment.

Referring now to FIG. 10, a description will be given of the fan controlling operation in which the information processing apparatus 10 refers to the fan table 313 to control the heat dissipation fan 35. FIG. 10 is a flowchart illustrating an example of the fan control process according to the present embodiment.

(Step S301) The embedded controller 31 (the fan control unit 312) acquires the detection results (detected temperatures) of the temperature sensors 36 (36a to 36e). Then, the embedded controller 31 proceeds to the processing of step S303.

(Step S303) The fan control unit 312 refers to the fan control table 313A set in the fan mode setting illustrated in FIG. 9 and compares the detected temperatures acquired in step S301 with the threshold values of the low-speed rotation, the medium-speed rotation, and the high-speed rotation in the fan control table 313A (Enable temperatures LTe, MTe, HTe, and Disable temperatures LTd, MTd, HTd). The fan control table 313A to be referred to is one set table among, for example, the fan control table FT_A1 for the Quiet mode, the fan control table FT_A2 for the Balance mode, and the fan control table FT_A3 for the Performance mode illustrated in FIG. 7A. Then, the fan control unit 312 proceeds to the processing of step S305.

(Step S305) The fan control unit 312 determines whether a condition for changing the rotation speed is satisfied on the basis of the result of the comparison between the detected temperatures and the threshold values in the fan control table 313A in step S303. For example, the change condition is that a detected temperature reaches the threshold value of one of the enable temperatures LTe, MTe, and HTe, or that the detected temperature drops to below the threshold value of one of the disable temperatures LTd, MTd, and HTd. If the fan control unit 312 determines that the condition for changing the rotation speed is not satisfied (NO), then the fan control unit 312 returns to the processing of step S301. On the other hand, if the fan control unit 312 determines that the condition for changing the rotation speed is satisfied (YES), then the fan control unit 312 proceeds to the processing of step S307.

(Step S307) The fan control unit 312 changes the rotation speed of the heat dissipation fan 35 by referring to the rotation speed for the open state or the rotation speed for the closed state set in the fan rotation speed setting illustrated in FIG. 8 (refer to the fan rotation speed table 313B in FIG. 7B). For example, when the fan control unit 312 controls to the low-speed rotation due to the fact that the condition for changing the rotation speed has been satisfied in step S305, the fan control unit 312 controls the rotation speed to 2850 rpm if the state is the open state or to 3050 rpm if the state is the closed state. Further, in the case where the fan control unit 312 controls to the medium-speed rotation due to the fact that the condition for changing the rotation speed has been satisfied in step S305, the fan control unit 312 controls to 3850 rpm when the state is the open state or to 4350 rpm when the state is the closed state. In the case where the fan control unit 312 controls to the high-speed rotation due to the fact that the condition for changing the rotation speed has been satisfied in step S305, the fan control unit 312 controls to 4750 rpm when the state is the open state or to 5450 rpm when the state is the closed state. In the case where the fan control unit 312 controls to the rotation stop due to the fact that the condition for changing the rotation speed in step S305 has been satisfied, the fan control unit 312 stops the rotation whether the state is the open state or the closed state.

As described above, the information processing apparatus 10 according to the present embodiment includes the device chassis 102 (an example of the first chassis) having the keyboard surface 102a (an example of the first surface) provided with at least the air intake ports 81, the display chassis 101 (an example of the second chassis) having the display surface 101a (an example of the second surface) that is connected to the device chassis 102 in a relatively rotatable manner and overlaps with the keyboard surface 102a of the device chassis 102 due to the rotation, and the heat dissipation fan 35 (an example of the heat dissipation unit) having a fan for replacing the air in the device chassis 102 with outside air at least through the intake ports 81. The information processing apparatus 10 detects whether the state is the closed state (an example of the first state), in which the keyboard surface 102a and the display surface 101a overlap, and changes the control of the heat dissipation fan 35 according to whether the state is the closed state.

Consequently, even if the information processing apparatus 10, which takes air in from at least the keyboard surface 102a side, is in a closed state and the air intake efficiency is reduced because the air intake ports 81 are covered by the display chassis 101 (the display surface 101a), the closed state can be detected and the control of the heat dissipation fan 35 can be changed, thus suppressing the deterioration of heat dissipation performance due to a usage state.

For example, the information processing apparatus 10 performs the control such that the rotation speed of the heat dissipation fan 35 is relatively higher in the closed state than in the open state (an example of the second state).

Consequently, even if the closed state results in the deterioration of the air intake efficiency as compared with the open state, the information processing apparatus 10 can set the rotation speed of the heat dissipation fan 35 to be higher than that in the open state, thus making it possible to suppress the deterioration of the heat dissipation performance due to a usage state.

More specifically, for example, the information processing apparatus 10 controls the rotation speed of the heat dissipation fan 35 on the basis of the detection results of the temperature sensors 36 that detect the temperature inside the device chassis 102 by referring to the fan table 313 (an example of the setting information), in which the temperature and the rotation speed of the heat dissipation fan 35 are associated. In the fan table 313, the fan rotation speed table 313B (refer to FIG. 7B) includes the setting information of the rotation speed for the closed state to be referred to when the state is the closed state (the first setting information) and the setting information of the rotation speed for the open state to be referred to when the state is the open state (the second setting information). Further, the setting information of the rotation speed for the closed state is set such that the rotation speed of the heat dissipation fan 35 at the same temperature is higher than that in the setting information of the rotation speed for the open state.

Thus, the information processing apparatus 10 has the setting information of the rotation speed for each of the open state and the closed state in advance, and the rotation speed of the heat dissipation fan 35 at the same temperature is set to be higher in the closed state than in the open state, so that the deterioration of the heat dissipation performance can be suppressed when the state is set to the closed state.

As an example, the amount by which the sound volume generated when the rotation speed of the heat dissipation fan 35 remains the same is smaller in the closed state than in the open state is converted to an increase in the rotation speed, and the setting information of the rotation speed for the closed state is set such that the rotation speed of the heat dissipation fan 35 at the same temperature is higher than that in the setting information of the rotation speed for the open state.

Consequently, the information processing apparatus 10 can suppress the deterioration of the heat dissipation performance when the state is set to the closed state, while maintaining the sound (noise) generated by rotating the heat dissipation fan 35 approximately at the same level in both the closed state and the open state.

Further, each of the setting information of the rotation speed for the closed state and the setting information of the rotation speed for the open state is further associated with a plurality of types of setting modes (e.g., the Quiet mode, the Balance mode, the Performance mode, and the like) related to the performance of the CPU 11 (an example of the processor).

Consequently, the information processing apparatus 10 can suppress the deterioration of the heat dissipation performance when the state is set to the closed state also in the plurality of types of setting modes related to the performance of the CPU 11.

Further, a plurality of keys (an example of operators) for accepting user operations are arranged on the keyboard surface 102a of the device chassis 102. The air intake ports 81 are provided corresponding to at least a part of the periphery of each of the plurality of keys.

Consequently, the information processing apparatus 10 has the air intake ports 81 at the gaps between keys of the keyboard 32, so that the air intake area can be secured without compromising the design, thus making it advantageous for reducing the size and the thickness.

Second Embodiment

A second embodiment of the present invention will now be described.

In the present embodiment, a description will be given of the fan control processing when an opening angle θ of an information processing apparatus 10 is approximately 360° (when used in a so-called tablet mode). The basic configuration of the information processing apparatus 10 according to the present embodiment is the same as the configuration illustrated in FIG. 1 to FIG. 3, FIG. 5, and FIG. 6, so that the descriptions thereof will be omitted, and the processing specific to the present embodiment will be described.

Figure 11:
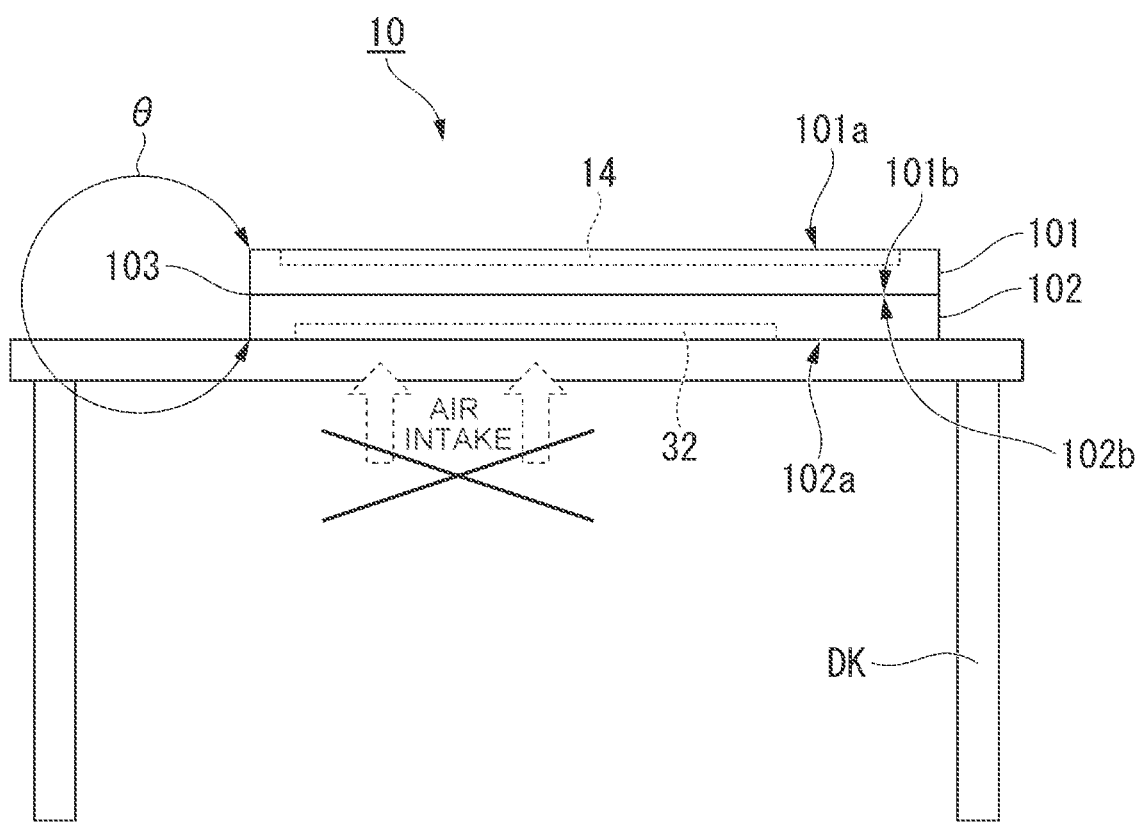
FIG. 11 is a diagram illustrating an example of the usage state of an information processing apparatus according to a second embodiment.

FIG. 11 is a diagram illustrating an example of the usage state of the information processing apparatus 10 according to the present embodiment. The information processing apparatus 10 is placed on a desk DK with the opening angle θ of approximately 360°. The state in which the opening angle θ is approximately 360° is a state in which a top surface 101b of a display chassis 101 and a bottom surface 102b of a device chassis 102 face each other and overlap. When used while being placed on the desk DK, as an example, a display surface 101a of the display chassis 101 faces upward as does the top surface of the desk DK, while a keyboard surface 102a of the device chassis 102 faces downward in contact with the top surface of the desk DK, as illustrated in the drawing. In this state, as in the closed state described in the first embodiment, it becomes difficult to take in outside air through air intake ports 81 provided on the keyboard surface 102a side. On the other hand, since the keyboard surface 102a is covered by the top surface of the desk DK, the sound or the sound resonance leaking out of the device chassis 102 is reduced.

Therefore, the information processing apparatus 10 may detect the state in which the information processing apparatus 10 is placed on the desk DK with the opening angle θ being approximately 360° as illustrated in FIG. 11, and control the rotation speed of the heat dissipation fan 35 to be relatively higher as in the case of the closed state. Hereinafter, the state in which the opening angle θ of the information processing apparatus 10 is approximately 360° will be referred to as the "tablet mode."

For example, a state detection unit 311 determines the opening angle θ between the display chassis 101 and the device chassis 102 on the basis of the detection signals output from acceleration sensors 37 (37A and 37B), and determines that the information processing apparatus 10 is in the tablet mode if the opening angle θ is equal to or more than a third threshold value set in advance. On the other hand, if the opening angle θ is below a fourth threshold value set in advance, then the state detection unit 311 determines that the mode is not in the tablet mode. The third threshold value is a threshold value for determining that the mode has been set to the tablet mode. The fourth threshold value is a threshold value for determining that the mode is no longer the tablet mode. The fourth threshold value is smaller than the threshold value, and a hysteresis characteristic is provided for determining whether the mode is the tablet mode. As an example, the third threshold value may be 355° and the second threshold value may be 350°. Further, the state detection unit 311 outputs state detection information indicating whether the mode is the tablet mode to a BIOS control unit 100.

Further, the state detection unit 311 detects the placement state of the information processing apparatus 10. For example, based on the detection results of the acceleration sensors 37 (37A and 37B), the state detection unit 311 detects, as the placement state, whether the information processing apparatus 10 is placed on a desk. More specifically, based on the detection results of the acceleration sensors 37 (37A and 37B), the state detection unit 311 detects the direction or the amount of vibration or the like of the device chassis 102, and detects whether the information processing apparatus 10 is placed on a desk on the basis of the detection results. For example, the state detection unit 311 detects that the information processing apparatus 10 is placed on a desk if the keyboard surface 102a of the device chassis 102 is facing the direction of gravity and the amount of vibration is below a predetermined value.

Here, the phrase "the state of being placed on a desk" is a generic term for the state in which the information processing apparatus 10 is supported by a stationary object, and is not limited to only on a desk, but also on a floor or on a shelf. Further, when detecting the placement state, the state detection unit 311 may detect a stationary state in which the amount of vibration of the information processing apparatus 10 is below a predetermined value, instead of the state of being placed on a desk. In other words, the state of being placed on a desk can be rephrased as the stationary state.

Thus, the state of being placed, which is equivalent to the state of being placed on a desk, can be defined by various criteria. The state detection unit 311 outputs the state detection information indicating the detected placement state (e.g., information indicating whether the information processing apparatus 10 is being placed on a desk) to the BIOS control unit 100.

To detect the placement state, a gyro sensor, a tilt sensor, or a geomagnetic sensor, or the like may be used in place of or in addition to the acceleration sensors 37.

If the BIOS control unit 100 acquires, from the state detection unit 311, the state detection information indicating that the mode is the tablet mode and the state detection information indicating that the information processing apparatus 10 is being placed on a desk, then the BIOS control unit 100 outputs fan rotation speed setting information indicating an instruction to refer to the setting information of the rotation speed for the closed state in the fan rotation speed table 313B illustrated in FIG. 7B. This enables a fan control unit 312 to perform control such that the rotation speed of the heat dissipation fan 35 becomes relatively higher by referring to the setting information of the rotation speed for the closed state as in the case of the closed state according to the first embodiment even if the information processing apparatus 10 is in the tablet mode and is being placed on a desk with the keyboard surface 102a facing down, as illustrated in FIG. 11.

The setting information of the rotation speed to be referred to in the case where the information processing apparatus 10 is in the tablet mode and being placed on a desk with the keyboard surface 102a facing down may be provided separately from the setting information of the rotation speed for the closed state.

As described above, the information processing apparatus 10 according to the present embodiment detects whether the mode is the tablet mode (an example of the third state), in which the bottom surface 102b, which is the opposite surface of the keyboard surface 102a (an example of the first surface), and the top surface 101b, which is the opposite surface of the display surface 101a (an example of the second surface), overlap due to the rotation of the device chassis 102 (an example of the first chassis) and the display chassis 101 (an example of the second chassis). In addition, the information processing apparatus 10 detects the placement state of the information processing apparatus 10. For example, the information processing apparatus 10 detects whether the information processing apparatus 10 is placed on a desk on the basis of the detection signals of the acceleration sensors 37 (37A and 37B). Then, the information processing apparatus 10 controls the rotation speed of the heat dissipation fan 35 according to whether the mode is the tablet mode and the placement state of the information processing apparatus 10. For example, if it is detected that the information processing apparatus 10 is in the tablet mode and the information processing apparatus 10 is being placed on a desk with the keyboard surface 102a (an example of the first surface) facing down, then the information processing apparatus 10 controls the rotation speed of the heat dissipation fan 35 in the same manner as when the state is the closed state (an example of the first state).

Consequently, the information processing apparatus 10 adapted to take air in from at least the keyboard surface 102a side can perform control such that the rotation speed of the heat dissipation fan 35 becomes relatively higher as with the case of the closed state even when the information processing apparatus 10 is in the tablet mode and placed on a desk with the keyboard surface 102a facing down, thus making it possible to suppress the deterioration of the heat dissipation performance due to a usage state.

The information processing apparatus 10 may perform control such that the rotation speed of the heat dissipation fan 35 becomes relatively higher as with the case of the closed state (an example of the first state) regardless of whether the mode is the tablet mode, if it is detected that the information processing apparatus 10 is being placed on a desk with the keyboard surface 102a facing down.

Third Embodiment

A third embodiment of the present invention will now be described.

Figure 12:
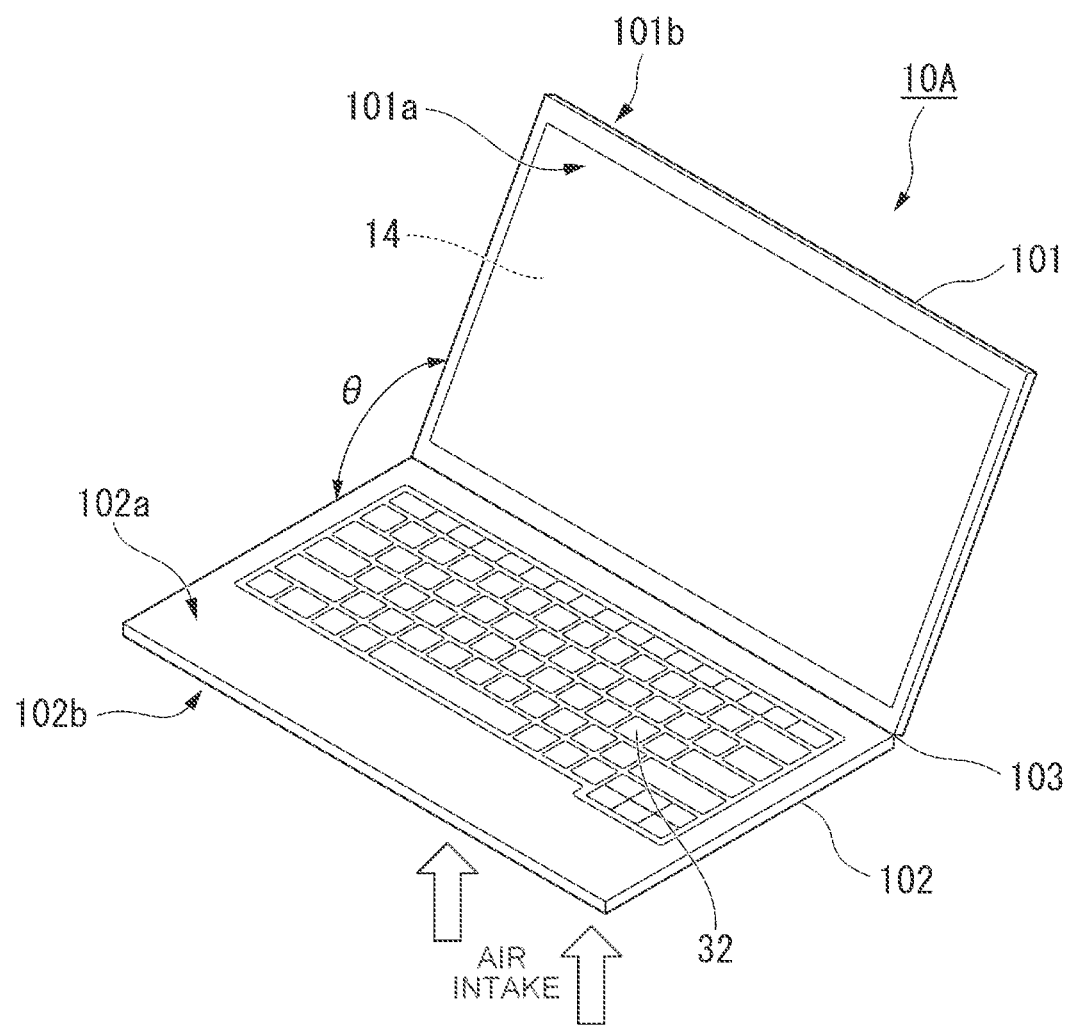
FIG. 12 is a perspective view illustrating the appearance of an information processing apparatus according to a third embodiment.

FIG. 12 is a perspective view illustrating the appearance of an information processing apparatus 10A according to the present embodiment. The information processing apparatus 10A illustrated differs from the information processing apparatus 10 illustrated in FIG. 1 in that the information processing apparatus 10A takes air in from a bottom surface 102b side. In other words, the basic configuration of the information processing apparatus 10A is the same as the configuration of the information processing apparatus 10 illustrated in FIG. 1, FIG. 2, FIG. 5, and FIG. 6 except for the placement of air intake ports 81 (refer to FIG. 2), so that the description thereof will be omitted, and the processing specific to the present embodiment will be described.

Figure 13:
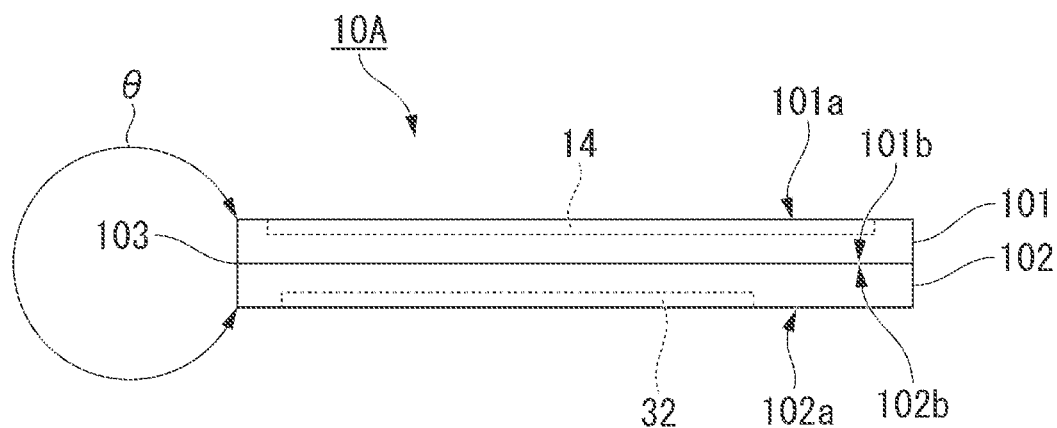
FIG. 13 is a diagram illustrating an example of the usage state of the information processing apparatus according to the third embodiment.

FIG. 13 is a diagram illustrating an example of the information processing apparatus 10A according to the present embodiment being used in the tablet mode. When the information processing apparatus 10A is used in the tablet mode, in which an opening angle θ is approximately 360°, a bottom surface 102b overlaps a top surface 101b of a display chassis 101, so that the air intake efficiency deteriorates.

Therefore, the information processing apparatus 10A may detect that the mode is the tablet mode and perform control such that the rotation speed of a heat dissipation fan 35 becomes relatively higher as with the case of a closed state. The method for a state detection unit 311 to detect whether the mode is the tablet mode is the same as the detection method described in the second embodiment.

When a BIOS control unit 100 acquires, from the state detection unit 311, state detection information indicating that the mode is the tablet mode, the BIOS control unit 100 outputs fan rotation speed setting information indicating an instruction to refer to the setting information of the rotation speed for the tablet mode. The setting information of the rotation speed for the tablet mode corresponds to the setting information of the rotation speed for the closed state in a fan rotation speed table 313B illustrated in FIG. 7B. For example, according to the present embodiment, in the fan rotation speed table 313B, at least the setting information of the rotation speed other than the tablet mode and the setting information of the rotation speed for the tablet mode are set. As illustrated in FIG. 13, if the mode is the tablet mode, then a fan control unit 312 can refer to the setting information of the rotation speed for the tablet mode and perform control such that the rotation speed of a heat dissipation fan 35 becomes relatively higher.

The air intake ports 81 may be provided not only in the bottom surface 102b but also in a part of a side surface of a device chassis 102 or a keyboard surface 102a, or the like other than the bottom surface 102b.

As described above, the information processing apparatus 10A according to the present embodiment includes the device chassis 102 (an example of the first chassis) having the bottom surface 102b (an example of the first surface) provided with at least the air intake ports 81, the display chassis 101 (an example of the second chassis) which is connected to the device chassis 102 in a relatively rotatable manner and which has the top surface 101b (an example of the second surface) that overlaps with the bottom surface 102b of the device chassis 102 by the rotation, and the heat dissipation fan 35 (an example of the heat dissipation unit) having a fan for replacing the air in the device chassis 102 with outside air through at least the air intake ports 81. The information processing apparatus 10A detects whether the mode is the tablet mode (an example of the first state), in which the bottom surface 102b and the top surface 101b overlap, and changes the control of the heat dissipation fan 35 according to whether the mode is the tablet mode. Here, a keyboard surface 102a, which is the surface opposite from the bottom surface 102b (an example of the first surface) of the device chassis 102 (an example of the first chassis), is provided with a keyboard 32, in which a plurality of keys (an example of operators) accepting user operations are arranged. Further, the opposite surface of the top surface 101b (an example of the second surface) of the display chassis 101 (an example of the second chassis) is provided with a display unit 14.

Consequently, the information processing apparatus 10A adapted to take air in from at least the bottom surface 102b side performs control such that the rotation speed of the heat dissipation fan 35 becomes relatively higher if the mode is the tablet mode, thus making it possible to suppress the deterioration of the heat dissipation performance due to a usage state.

Although the above has described in detail the embodiments of the present invention with reference to the accompanying drawings, the specific configurations are not limited to the ones described above, and various design changes and the like can be made within a scope that does not deviate from the gist of the present invention. For example, the configurations described in the above-described embodiments may be freely combined.

In the above-described embodiments, the configuration examples in which the state detection unit 311 is included in the embedded controller 31 have been shown, but the present invention is not limited thereto. For example, the OS 120 or the BIOS control unit 100 may have the function of the state detection unit 311. Further, the embedded controller 31 is an example of a microcomputer, and is not limited thereto.

The information processing apparatuses 10 (10A) have the computer systems therein. Further, a program for implementing the functions of each constituent provided by each of the above-described information processing apparatuses 10 (10A) may be recorded on a computer-readable recording medium, and the program recorded on the recording medium may be read into the computer system and executed thereby to perform processing in each constituent provided by each of the above-described information processing apparatuses 10 (10A). Here, "having a computer system read and execute a program recorded on a recording medium" includes installing the program on the computer system. The term "computer system" as used herein includes an OS and hardware such as peripheral devices. Further, the "computer system" may also include a plurality of computer devices connected through a network including communication lines such as the Internet, WAN, LAN, and dedicated lines. Further, a "computer-readable recording medium" refers to a portable medium such as a flexible disk, a magneto-optical disk, a ROM, a CD-ROM, or the like, or a storage device such as a hard disk built into a computer system. Thus, the recording medium that stores a program may be a non-transitory recording medium such as a CD-ROM.

Further, the recording medium also includes an internal or external recording medium that can be accessed from a distribution server to distribute the program. A configuration may be used in which a program is divided into a plurality of parts and then downloaded at different times and thereafter combined in each constituent provided in the information processing apparatus 10 (10A), or the distribution servers that deliver the divided programs may be different from each other. Further, "computer-readable recording media" include those that hold a program for a certain period of time, such as a volatile memory (RAM) inside a computer system that serves as a server or a client when a program is transmitted through a network. In addition, the program may be used to implement some of the functions described above. Further, the program may be one that can implement the above-described functions in combination with a program already recorded in the computer system, which is a so-called difference file (difference program).

Further, some or all of the functions provided in the information processing apparatuses 10 (10A) may be implemented as an integrated circuit, such as an LSI (Large Scale Integration). The functions may be individually made into a processor, or may be partially or fully integrated into a processor. In addition, the integrated circuit method is not limited to an LSI, but can also be implemented by a dedicated circuit or a general-purpose processor. Further, when an integrated circuit technology that replaces an LSI appears due to advances in semiconductor technology, an integrated circuit based on such technology may be used.

The invention claimed is:

1. An information processing apparatus comprising:
   a first chassis having a first surface with at least an air intake port therein;
   a second chassis which is rotatably connected to the first chassis and has a second surface that is configured to overlap the first surface of the first chassis by rotation;
   a heat dissipation unit having a fan for replacing air in the first chassis with outside air through at least the air intake port;
   a state detection unit that detects whether an operating state is a first closed state in which the first surface and the second surface overlap; and
   a control unit which changes control of the fan according to whether the operating state is the closed state or is an open state wherein the first and second surfaces are angularly disposed to one another in excess of a threshold angle;
   wherein the control unit performs control such that a rotation speed of the fan is increased when the information processing apparatus is in the closed state when compared to the open state;
   wherein, when the control unit performs the control, an amount of the increased rotation speed is based on a conversion of a difference in sound volumes generated by rotation of the fan at a same rotation speed in the closed state and in the open state.

2. The information processing apparatus according to claim 1,
   wherein the control unit refers to setting information that associates a temperature with a rotation speed of the fan to control the rotation speed of the fan on the basis of a detection result of a sensor that detects a temperature in the first chassis, and in the setting information, a first setting information that is referred to in the closed state is set such that the rotation speed of the fan at a given temperature is higher than that of second setting information that is referred to in the open state.

3. The information processing apparatus according to claim 2,
wherein each of the first setting information and the second setting information is further associated with a plurality of types of setting modes related to performance of a processor.

4. The information processing apparatus according to claim 1,
wherein a plurality of operators that accept user operations are arranged on the first surface, and
the air intake port is at least positioned at a part of a periphery of each of the plurality of operators.

5. The information processing apparatus according to claim 4,
wherein the state detection unit detects whether the operating state is a third state in which an opposite surface of the first surface and an opposite surface of the second surface overlap by rotation of the first chassis and the second chassis, and further detects a placement state of the information processing apparatus, and
the control unit controls the rotation speed of the fan on the basis of whether the operating state is the third state and the placement state of the information processing apparatus.

6. The information processing apparatus according to claim 1,
wherein a plurality of operators that accept user operations are arranged on an opposite surface of the first surface of the first chassis, and
a display unit is provided on an opposite surface of the second surface of the second chassis.

7. A control method in an information processing apparatus that includes a first chassis having a first surface with at least an air intake port therein; a second chassis which is rotatably connected to the first chassis and has a second surface that is configured to overlap the first surface of the first chassis by rotation; and a heat dissipation unit having a fan for replacing air in the first chassis with outside air through at least the air intake port, the control method comprising:
a step in which a state detection unit detects whether an operating state is a closed state in which the first surface and the second surface overlap; and
a step in which a control unit changes control of the fan according to whether the operating state is the closed state or is an open state wherein the first and second surfaces are angularly disposed to one another in excess of a threshold angle;
a step in which the control unit performs control such that a rotation speed of the fan is increased when the information processing apparatus is in the closed state when compared to the open state;
wherein, when the control unit performs the control, an amount of the increased rotation speed is based on a conversion of a difference in sound volumes generated by rotation of the fan at a same rotation speed in the closed state and in the open state.

* * * * *